United States Patent
Harada et al.

(10) Patent No.: US 8,558,724 B2
(45) Date of Patent: Oct. 15, 2013

(54) CODING METHOD, CODING APPARTAUS, DECODING METHOD, DECODING APPARATUS, PROGRAM, AND RECORDING MEDIUM

(75) Inventors: Noboru Harada, Kanagawa (JP); Yutaka Kamamoto, Kanagawa (JP); Takehiro Moriya, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 107 days.

(21) Appl. No.: 13/319,431

(22) PCT Filed: May 19, 2010

(86) PCT No.: PCT/JP2010/058467
§ 371 (c)(1),
(2), (4) Date: Jan. 4, 2012

(87) PCT Pub. No.: WO2010/134553
PCT Pub. Date: Nov. 25, 2010

(65) Prior Publication Data
US 2012/0092197 A1    Apr. 19, 2012

(30) Foreign Application Priority Data

May 20, 2009 (JP) ................................. 2009-122088

(51) Int. Cl.
*H03M 7/00* (2006.01)
(52) U.S. Cl.
USPC ................................. 341/50; 341/51; 341/67
(58) Field of Classification Search
USPC ............................................. 341/50, 51, 67
See application file for complete search history.

(56) References Cited

U.S. PATENT DOCUMENTS 6,005,503 A * 12/1999 Burrows ........................ 341/67
7,126,501 B2 * 10/2006 Moriya et al. ................. 341/50

(Continued)

FOREIGN PATENT DOCUMENTS

| JP | 2004 104159 | 4/2004 |
| JP | 2008 514142 | 5/2008 |
| WO | 2009 075326 | 6/2009 |
| WO | 2010 104011 | 9/2010 |

OTHER PUBLICATIONS

Notification of Reasons for Refusal issued Feb. 14, 2012 in Japanese Patent Application No. 2011-514438 (with English translation).

(Continued)

*Primary Examiner* — Khai M Nguyen
(74) *Attorney, Agent, or Firm* — Oblon, Spivak, McClelland, Maier & Neustadt, L.L.P.

(57) ABSTRACT

An integer value sequence is used as an input, and [1] codes corresponding to integers (referred to as specified integers) and [2] codes (referred to as extension codes) corresponding to sets of a plurality of integers other than the specified integers are previously determined. Coding is performed in such a manner that the code corresponding to the specified integer is adopted as the result of the coding if an integer value to be coded in the integer value sequence is the specified integer, and a code obtained by combining the extension code and a code obtained by applying a predetermined coding method corresponding to the extension code to the integer value to be coded is adopted as the result of the coding if the integer value to be coded in the integer value sequence is not the specified integer.

38 Claims, 28 Drawing Sheets

(56) References Cited

U.S. PATENT DOCUMENTS

| | | | |
|---|---|---|---|
| 7,230,551 B2* | 6/2007 | Moriya et al. | 341/83 |
| 7,948,406 B2* | 5/2011 | Chen et al. | 341/67 |
| 2006/0071826 A1 | 4/2006 | Saunders et al. | |
| 2006/0071827 A1 | 4/2006 | Lynch et al. | |
| 2006/0072834 A1 | 4/2006 | Lynch et al. | |
| 2006/0072837 A1 | 4/2006 | Ralston et al. | |
| 2010/0265111 A1 | 10/2010 | Harada et al. | |

OTHER PUBLICATIONS

Liebchen, T., et al., "MPEG-4 ALS: an Emerging Standard for Lossless Audio Coding," Proceedings of the Data Compression Conference (DCC' 04), pp. 439-448, (Mar. 2004).

ITU-T Telecommunication Standardization Sector of ITU, G.711, General Aspects of Digital Transmission Systems, Terminal Equipments, Pulse Code Modulation (PCM) of Voice Frequencies, ITU-T Recommendation G.711, International Telecommunication Union, Total 12 Pages, (1993).

ISO/IEC 14496-3: 2005, FDAM 2, Information technology—Coding of audio-visual objects—Part 3: Audio: Amendment 2: Audio Lossless Coding (ALS), new audio profiles and BSAC extensions, ISO/IEC, Total 88 Pages, (2005).

Salomon, D., "Data Compression: The Complete Reference," Springer-Verlag, $3^{rd}$ Edition, pp. 57-73, ISBN:0-387-40697-2, (2004).

ITU-T Telecommunication Standardization Sector of ITU, G.701, General Aspects of Digital Transmission Systems, Vocabulary of Digital Transmission and Multiplexing, and Pulse Code Modulation (PCM) Terms, ITU-T Recommendation G.701, International Telecommunication Union, Total 41 Pages, (Mar. 1993).

International Search Report Issued Jul. 27, 2010 in PCT/JP10/058467 Filed May 19, 2010.

U.S. Appl. No. 13/202,335, filed Aug. 19, 2011, Moriya et al.

* cited by examiner

FIG.11 n>=40, B=0
TABLE 0
maxCode: 6
k: code
0: 1
1: 01
2: 001
3: 0001
4: 00001
5: 000001
p1: 000000
: -------- n>=40, B>=1
TABLE 0
maxCode: 6
k: code
0: 1
1: 01
2: 001
3: 0001
4: 00001
5: 000001
p2: 000000
: -------- n>=80, B=0

TABLE 0
maxCode: 7
K: code
0: 01
1: 10
2: 11
3: 001
4: 0001
5: 00001
6: 000000
p1: 000001

TABLE 1
maxCode: 7
k: code
0: 1
1: 01
2: 0001
3: 0010
4: 00001
5: 000000
6: 000001
p1: 0011

TABLE 2
maxCode: 7
k: code
0: 1
1: 01
2: 001
3: 00001
4: 00010
5: 000000
6: 000001
p1: 00011

TABLE 3
maxCode: 6
k: code
0: 1
1: 01
2: 001
3: 0001
4: 00001
5: 000000
p1: 000001
: -------- p1: code(U, k-maxCode)

n>=80, B>=1

TABLE 0
maxCode: 7
k: code
0: 01
1: 10
2: 11
3: 001
4: 0001
5: 00001
6: 000000
p2: 000001

TABLE 1
maxCode: 7
k: code
0: 1
1: 01
2: 0001
3: 0010
4: 00001
5: 000000
6: 000001
p2: 0011

TABLE 2
maxCode: 7
k: code
0: 1
1: 01
2: 001
3: 00001
4: 00010
5: 000000
6: 000001
p2: 00011

TABLE 3
maxCode: 6
k: code
0: 1
1: 01
2: 001
3: 0001
4: 00001
5: 000000
p2: 000001
: -------- p2: code(R, 1, k-maxCode)

FIG. 15

```
maxCode: 7
k: code
0: 01
1: 10
2: 11
3: 001
4: 0001
5: 00001
6: 000000
p1: 000001
```

| value | code | len | len |
|---|---|---|---|
| value[0] = 6 | // 000000 | value[32] = 1 // 100000 | len[0] = 6 | len[32] = 2 |

Full listing:

| | value / code | | len |
|---|---|---|---|
| value[0] = 6 | // 000000 | value[32] = 1 // 100000 | len[0] = 6 | len[32] = 2 |
| value[1] = 7 | // 000001 | value[33] = 1 // 100001 | len[1] = 6 | len[33] = 2 |
| value[2] = 5 | // 000010 | value[34] = 1 // 100010 | len[2] = 5 | len[34] = 2 |
| value[3] = 5 | // 000011 | value[35] = 1 // 100011 | len[3] = 5 | len[35] = 2 |
| value[4] = 4 | // 000100 | value[36] = 1 // 100100 | len[4] = 4 | len[36] = 2 |
| value[5] = 4 | // 000101 | value[37] = 1 // 100101 | len[5] = 4 | len[37] = 2 |
| value[6] = 4 | // 000110 | value[38] = 1 // 100110 | len[6] = 4 | len[38] = 2 |
| value[7] = 4 | // 000111 | value[39] = 1 // 100111 | len[7] = 4 | len[39] = 2 |
| value[8] = 3 | // 001000 | value[40] = 1 // 101000 | len[8] = 3 | len[40] = 2 |
| value[9] = 3 | // 001001 | value[41] = 1 // 101001 | len[9] = 3 | len[41] = 2 |
| value[10] = 3 | // 001010 | value[42] = 1 // 101010 | len[10] = 3 | len[42] = 2 |
| value[11] = 3 | // 001011 | value[43] = 1 // 101011 | len[11] = 3 | len[43] = 2 |
| value[12] = 3 | // 001100 | value[44] = 1 // 101100 | len[12] = 3 | len[44] = 2 |
| value[13] = 3 | // 001101 | value[45] = 1 // 101101 | len[13] = 3 | len[45] = 2 |
| value[14] = 3 | // 001110 | value[46] = 1 // 101110 | len[14] = 3 | len[46] = 2 |
| value[15] = 3 | // 001111 | value[47] = 1 // 101111 | len[15] = 3 | len[47] = 2 |
| value[16] = 0 | // 010000 | value[48] = 2 // 110000 | len[16] = 2 | len[48] = 2 |
| value[17] = 0 | // 010001 | value[49] = 2 // 110001 | len[17] = 2 | len[49] = 2 |
| value[18] = 0 | // 010010 | value[50] = 2 // 110010 | len[18] = 2 | len[50] = 2 |
| value[19] = 0 | // 010011 | value[51] = 2 // 110011 | len[19] = 2 | len[51] = 2 |
| value[20] = 0 | // 010100 | value[52] = 2 // 110100 | len[20] = 2 | len[52] = 2 |
| value[21] = 0 | // 010101 | value[53] = 2 // 110101 | len[21] = 2 | len[53] = 2 |
| value[22] = 0 | // 010110 | value[54] = 2 // 110110 | len[22] = 2 | len[54] = 2 |
| value[23] = 0 | // 010111 | value[55] = 2 // 110111 | len[23] = 2 | len[55] = 2 |
| value[24] = 0 | // 011000 | value[56] = 2 // 111000 | len[24] = 2 | len[56] = 2 |
| value[25] = 0 | // 011001 | value[57] = 2 // 111001 | len[25] = 2 | len[57] = 2 |
| value[26] = 0 | // 011010 | value[58] = 2 // 111010 | len[26] = 2 | len[58] = 2 |
| value[27] = 0 | // 011011 | value[59] = 2 // 111011 | len[27] = 2 | len[59] = 2 |
| value[28] = 0 | // 011100 | value[60] = 2 // 111100 | len[28] = 2 | len[60] = 2 |
| value[29] = 0 | // 011101 | value[61] = 2 // 111101 | len[29] = 2 | len[61] = 2 |
| value[30] = 0 | // 011110 | value[62] = 2 // 111110 | len[30] = 2 | len[62] = 2 |
| value[31] = 0 | // 011111 | value[63] = 2 // 111111 | len[31] = 2 | len[63] = 2 |

```
maxCode: 7
Len[0] = 2
Len[1] = 2
Len[2] = 2
Len[3] = 3
Len[4] = 4
Len[5] = 5
Len[6] = 6
Len[7] = 6
```

FIG. 21

● TABLE 1
0:0
1:10
2:110
3:1110
p:1111 || code(U,p-4)

FIG. 22

● TABLE 2

```
0:0
1:10
2:110
3:1110
p:11110 || code(U,p-4)
11111 || code(F,g,s-1) || code(R,s,p-4)
```

FIG. 23

● TABLE 3

```
0:0
1:10
2:110
3:1110
p:111100 || code(U,p-4)
  111101 || code(R,1,p-4)
  111110 || code(R,2,p-4)
  111111 || code(F,g,s-3) || code(R,s,p-4)
```

FIG. 24

● TABLE 4

0:0
1:10
2:110
3:1110
p:11110 || code(U,p-4:4≦p≦6)
11110 || code(U,p-12:15≦p)
11111 || code(F,h,p-7:7≦p≦14)

FIG. 25

● TABLE 5

0:0
1:10
2:110
3:1110
4:11100
p:111101 || code(U,p-5)
111110 || code(F,3,p-5)
111111 || code(F,4,p-5)

FIG. 26

● TABLE 6

0:0
1:10
2:1110
4:11111
p:1110 || code(U,p-3:p=3)
1110 || code(U,p-4:5≦p)
110 || code(F,3,p-4:5≦p)

FIG. 27

● TABLE 7

0:00
1:01
2:100
3:101
4:1100
5:1101
6:11100
7:11101
p:1111 || code(U,p-4)

FIG. 28

● TABLE 8

0:00
1:01
2:100
3:101
4:1100
5:1101
p:1111 || code(U,p-4)

CODING METHOD, CODING APPARTAUS, DECODING METHOD, DECODING APPARATUS, PROGRAM, AND RECORDING MEDIUM

TECHNICAL FIELD

The present invention relates to a signal coding technique. More specifically, it relates to a lossless coding technique for an integer value sequence.

BACKGROUND ART

International Telecommunication Union Telecommunication Standardization Sector (ITU-T) G. 711 is an international standard for coding of voice-frequency signals (see Non-patent literature 1). ITU-T G.711 adopts non-uniform pulse code modulation (non-uniform PCM) as a coding scheme and defines two types of nonlinear quantization schemes: μ-law and A-law. In the following, the "voice-frequency signal" will be referred to as an audio signal.

MPEG-4 is an international standard for visual and audio coding formulated by ISO/IEC JTC 1/SC 29 WG 11, and MPEG-4 Part 3 prescribes an audio lossless coding technique and the like (see Non-patent literature 2).

Unary coding is a known coding method for an integer (see Non-patent literature 3). Unary coding is to express an integer k (equal to or greater than 0) in the form of k successive integers A and the following one integer B. The integer B differs from the integer A. If the integer A is 1, the integer B is 0. If the integer A is 0, the integer B is 1.

For example, a unary code expressing an integer k=0 is 0 (or 1). A unary code expressing an integer k=1 is 10 (or 01). A unary code expressing an integer k=2 is 110 (or 001). A unary code expressing an integer k=3 is 1110 (or 0001). A unary code expressing an integer k=4 is 11110 (or 00001). A unary code expressing an integer k=5 is 111110 (or 000001).

Unary coding is characterized in that: (1) any integer k can be coded regardless of how large it is, (2) an integer k is coded and decoded without using a table that associates the integer k with a code, so that there is no need for a memory for storing the table, (3) a code expressing an integer k comprises k+1 bits, and (4) a code expressing a large integer k comprises a larger number of bits than a binary code expressing the same integer k.

Huffman coding is a known entropy coding method (see Non-patent literature 3). Huffman coding is to assign a variable length code to an input value to be coded according to the appearance frequency of the input value. The higher the appearance frequency of the input value, the shorter the code assigned to the value is.

Huffman coding is characterized in that: (1) an input value is coded and decoded by using a table that associates the input value with a code, (2) the maximum value that can be coded depends on the size of the table (that is, a larger table is needed as the variety of the input values to be coded increases), and (3) in the case where a large table is used, a Huffman code expressing an input value that appears less frequently may comprise a larger number of bits than a binary code expressing the same input value.

Golomb-Rice coding is also a known coding method for an integer (see Non-patent literature 3). A Golomb-Rice code expressing an integer t that is equal to or greater than 0 is obtained by coding a quotient q determined according to the following formula (1) using a predetermined integer s (Rice parameter) into a unary code, coding the remainder r determined according to the following formula (2) into an s-bit binary code, and combining the unary code of the quotient q and the binary code of the remainder r. In the following formulas, the symbol $\lfloor \cdot \rfloor$ represents a floor function.

$$q = \left\lfloor \frac{t}{2^s} \right\rfloor \quad (1)$$

$$r = t - q \cdot 2^s \quad (2)$$

Golomb-Rice coding is characterized in that: (1) the length of a Golomb-Rice code depends on the integer s, (2) a Golomb-Rice code expressing the integer t comprises q+s+1 bits, (3) the larger the integer t, the longer the Golomb-Rice code expressing the integer t is, since Golomb-Rice coding involves unary coding of the quotient q, and (4) in the case where the input value may be positive or negative, the input value is converted into an integer t equal to or greater than 0 before Golomb-Rice coding.

PRIOR ART LITERATURE

Non-Patent Literature

Non-patent literature 1: ITU-T Recommendation G.711, "Pulse Code Modulation (PCM) of voice frequencies," ITU-T, 1993

Non-patent literature 2: ISO/IEC 14496-3 AMENDMENT 2: Audio Lossless Coding (ALS), new audio profiles and BSAC extensions, 2005

Non-patent literature 3: David Salomon, "Data Compression: The Complete Reference," $3^{rd}$ edition, Springer-Verlag, ISBN-10: 0-387-40697-2, 2004

SUMMARY OF THE INVENTION

Problem to be Solved by the Invention

Terms used in this specification comply with ITU-T G.701 (Reference literature 1) unless otherwise specified. However, the range of application of the present invention is not limited to the technical fields to which the ITU-T G series recommendations are applied. The present invention can also be applied to a technical field other than those technical fields, such as the technical field concerning Non-patent literature 2 described above, by interchanging the terms used in this specification with any corresponding terms used in the technical field.

(Reference literature 1) ITU-T Recommendation G.701, "Vocabulary of Digital Transmission and Multiplexing, and Pulse Code Modulation (PCM) Terms," ITU-T, 1993

In the case where a coding process is performed in units of frames each comprising a predetermined number of samples, if the appearance frequency distribution of the values of the samples $x_i$ (i=1, 2, ..., N) in the frame follows the Laplace distribution, the Golomb-Rice code is the optimal among the integer codes. This is because if the appearance frequency distribution of the values of the samples $x_i$ (i=1, 2, ..., N) follows the Laplace distribution, the probability distribution of the quotients q assumes (discrete) values ½, ¼, ⅛, 1/16, ..., $1/2^h$ and so on, and the unary code is optimal.

If the appearance frequency distribution of the samples $x_i$ (i=1, 2, ..., N) included in the frame does not follow the Laplace distribution, or if the number of samples is statistically insufficient, the Golomb-Rice code is not always the optimal code. This is because the unary code has a larger code length because the probability distribution of the quotients q does not follow a probability distribution that is optimal for the unary code.

Huffman coding is known to be efficient for sample values in any appearance frequency distributions including the Laplace distribution, since a different Huffman code table based on statistical learning is used depending on the statistical appearance frequency of the sample values to be coded. However, if the possible range of the integer values to be coded is wide, a large Huffman code table has to be prepared, so that there arises a problem that the data volume of the Huffman code table is impractically large.

In view of such circumstances, an object of the present invention is to provide techniques of coding and decoding that can avoid an increase of the code length of a frame even if the appearance frequency distribution of values of samples $x_i$ (i=1, 2, ..., N) included in the frame does not follow a Laplace distribution or even if the number of samples is statistically insufficient.

Means to Solve the Problems

According to the present invention, [1] combinations of integers (referred to as specified integers hereinafter) and codes corresponding to the specified integers and [2] combinations of sets of a plurality of integers other than the specified integers and codes corresponding to the sets (referred to as extension codes hereinafter) are previously determined, and coding is performed in such a manner that an integer value sequence is input, and the code corresponding to the specified integer is adopted as the result of the coding in a case where an integer value to be coded in the integer value sequence is the specified integer, and a code obtained by combining the extension code and a code obtained by applying a predetermined coding method corresponding to the extension code to the integer value to be coded is adopted as the result of the coding in a case where the integer value to be coded in the integer value sequence is not the specified integer.

In decoding, if a code is a code corresponding to the specified integer, the specified integer corresponding to the code is adopted as the result of the decoding. If a code is the extension code, an integer obtained by decoding a code subsequent to the extension code according to a decoding method corresponding to the extension code is adopted as the result of the decoding.

Each sample in an input signal is expressed by an integer. A value for determining a divisor for the samples in the input signal (referred to as a separation parameter hereinafter) is determined on a frame basis, the frame including a predetermined number of samples. For each sample in the frame of the input signal, a quotient and a remainder are determined in a case where the divisor determined by the separation parameter is greater than 1, and a quotient is determined in a case where the divisor equals to 1. Then, the coding described above is applied to the quotient. The coding of the quotient is performed in such a manner that the code of the quotient is the code corresponding to the specified integer in a case where the quotient is the specified integer, and the code of the quotient is a code obtained by combining the extension code and a code obtained by applying the predetermined coding method corresponding to the extension code to the quotient in a case where the quotient is not the specified integer. Alternatively, a code table may be used in which [1] the combinations of the specified integers and the codes corresponding to the specified integers and [2] the combinations of the sets of a plurality of integers other than the specified integers and at least one extension code corresponding to the set are recorded.

Alternatively, an optimal one of a plurality of code tables may be selected and used for each frame that includes a predetermined number of samples.

A code is decoded as described below. That is, if a code of a quotient does not include the extension code, the specified integer corresponding to the code of the quotient is output. If a code of a quotient includes the extension code, a part of the code of the quotient excluding the extension code is decoded according to a decoding method corresponding to the coding method uniquely identified by the extension code, and the resulting integer is output. Then, it is determined whether or not the divisor is 1 or not. If the divisor is 1, the sample of the input signal is reproduced form the integer obtained by decoding the quotient. If the divisor is greater than 1, the sample of the input signal is reproduced by multiplying the integer obtained by decoding the quotient by the divisor and adding an integer obtained from a code of a remainder to the product.

Effects of the Invention

According to the present invention, a wide range of input signals can be handled and coded with high efficiency with a code table of a limited size.

According to the present invention, input signals can be coded with high efficiency, since a predetermined number of samples are collectively handled as a frame, and the optimal one of a plurality of code tables prepared for different appearance frequency distributions is selected and used for each frame.

According to the present invention, since the quotient of each sample in a frame is not coded into a unary code, the code length of the code of each sample and therefore the code length of the frame can be prevented from increasing even if the appearance frequency distribution of the samples $x_i$ (i=1, 2, ..., N) included in the frame does not follow the Laplace distribution or even if the number of samples is statistically insufficient.

BRIEF DESCRIPTION OF THE DRAWINGS

FIG. 11 shows exemplary code tables;

FIG. 15 shows exemplary decode tables corresponding to a code table 0 in the case where n≥80 shown in FIG. 11;

FIG. 21 shows an exemplary code table (Table 1);

FIG. 22 shows an exemplary code table (Table 2);

FIG. 23 shows an exemplary code table (Table 3);

FIG. 24 shows an exemplary code table (Table 4);

FIG. 25 shows an exemplary code table (Table 5);

FIG. 26 shows an exemplary code table (Table 6);

FIG. 27 shows an exemplary code table (Table 7); and

FIG. 28 shows an exemplary code table (Table 8).

DETAILED DESCRIPTION OF THE EMBODIMENTS

Summary of Coding According to Embodiment 1 of Invention

It is assumed that an input signal handled in an embodiment 1 is a sequence of integer values equal to or greater than 0. For example, as in the audio lossless coding technique disclosed in Non-patent literature 1, the integer value sequence may be an integer value sequence obtained by performing unique linear mapping of linear prediction residuals, which are obtained by a linear prediction analysis of an audio signal, to integer values equal to or greater than 0 in such a manner that the smaller the absolute value of the amplitude of the linear prediction residual, the smaller the value to which the linear prediction residual is mapped is.

Coding according to the embodiment 1 of the present invention can achieve high compression ratio when the input signal is a sequence of integer values equal to or greater than 0, and the input signal has a statistical characteristic that a particular range of integer values appears with a higher probability.

A coding apparatus has a code table that describes [1] a combination of an integer (referred to as a specified integer hereinafter) and a code corresponding to the integer and [2] at least one combination of a set of a plurality of integers other than the specified integer and one code corresponding to the set (referred to as an extension code hereinafter). The coding apparatus successively codes integer values to be coded in the integer value sequence of the input signal and outputs the resulting codes. An integer other than the specified integer will be referred to as a non-specified integer, hereinafter.

In the coding process, if the integer value to be coded in the integer value sequence of the input signal is the specified integer, the code corresponding to the specified integer is selected from the code table as the result of the coding. If the integer to be coded in the integer value sequence is a non-specified integer, the extension code recorded in the code table and a code obtained by applying a predetermined coding method corresponding to the extension code to the non-specified integer are combined, and the resulting code is adopted as the result of the coding.

Figure 1:
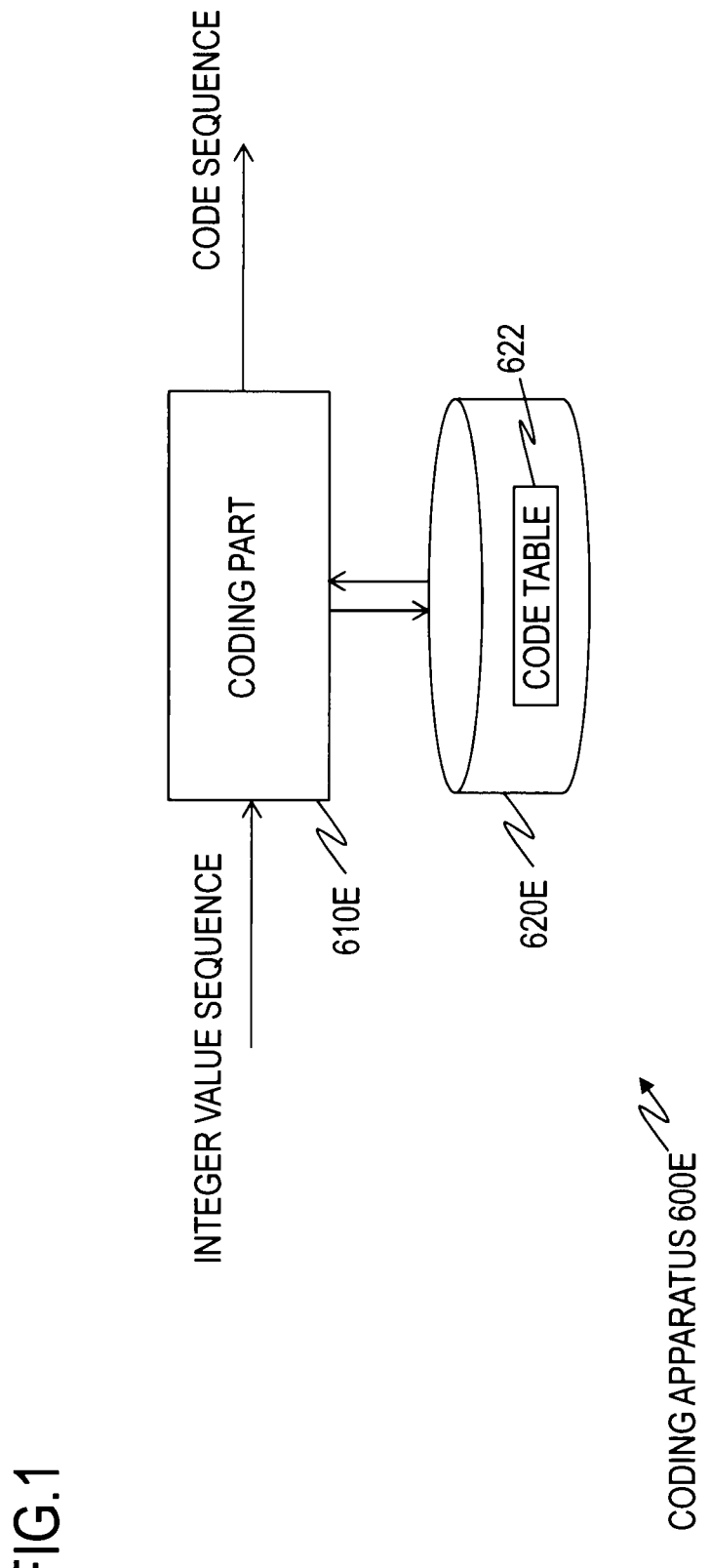
FIG. 1 is a block diagram showing an exemplary functional configuration of a coding apparatus according to an embodiment 1.

FIG. 1 shows an exemplary functional configuration of a coding apparatus 600E according to the embodiment 1.

The coding apparatus 600E comprises a storage part 620E that stores a code table 622, and a coding part 610E that receives an integer value sequence as an input, performs coding using the code table 622, and outputs the resulting code sequence.

Figure 2:
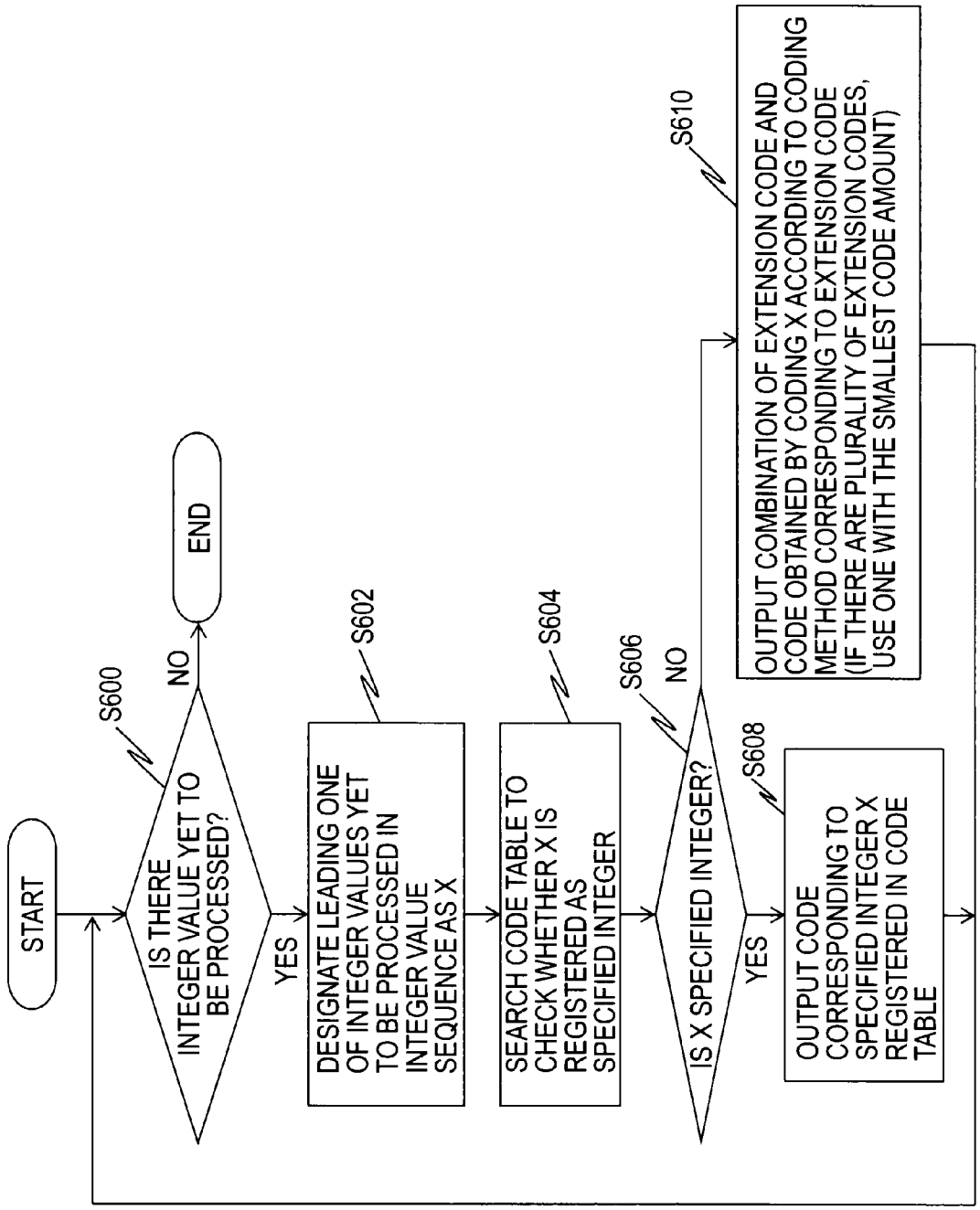
FIG. 2 is a diagram showing a flow of a coding process according to the embodiment 1.

FIG. 2 shows a coding procedure.

First, it is determined whether or not there is an integer value yet to be processed (step S600). If there is no such an integer value, the procedure is ended. If there is such an integer value, the leading one of such integer values in the integer value sequence is designated as X (step S602). Then, the code table 622 is searched to check whether or not X is registered as a specified integer (step S604). It is determined whether or not X is a specified integer (step S606). If X is a specified integer, the code corresponding to the specified integer X registered in the code table 622 is output (step S608). If X is not a specified integer, a combination of the extension code and a code obtained by coding X according to a coding method corresponding to the extension code is output (if there are a plurality of extension codes, the one with the smallest code amount is selected) (step S610).

Tables 1 to 6 are examples of the code table 622.

In the code tables shown as Tables 1 to 6, the left side of the colon (:) represents a specified integer, and the right side represents a code corresponding to the specified integer. A code corresponding to a non-specified integer p is expressed as a combination of an extension code and a code obtained by coding the non-specified integer p according to a coding method specific to the extension code. The symbol ∥ represents combination of codes.

The coding method corresponding to the extension code, which is specific to the extension code, is previously determined in the coding apparatus and a decoding apparatus. For lossless coding, the coding apparatus and the decoding apparatus have to use the same coding method, so that the coding method corresponding to the extension code is previously uniquely determined in the coding apparatus and the decoding apparatus. For simplicity, in the following description with regard to Tables 1 to 6, "U" represents unary coding, "R" represents Golomb-Rice coding, "F" represents fixed-length coding, and "code (U, k)", "code (R, s, k)", and "code (F, g, k)" represent the codes obtained by coding of a numerical value k according to the respective coding methods, for example.

Figure 21:
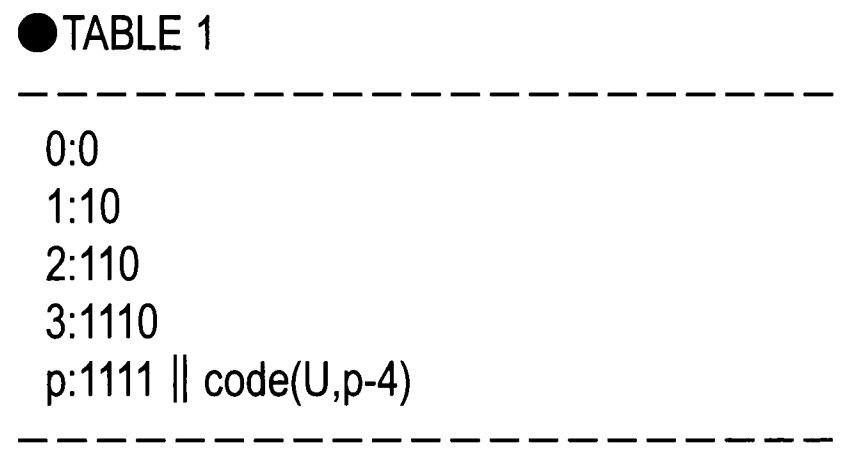

In the example of Table 1 (see FIG. 21), one extension code 1111 is specified. The coding method corresponding to the extension code 1111 is a unary code "code (U, p−4), which is previously uniquely determined in the coding apparatus and the decoding apparatus.

The unary code "code(U, p−4)" is a code obtained by unary coding of an integer p minus 4 (p−4) when the integer value to be coded is the non-specified integer p. In this example, it is assumed that p−4.

If the integer value to be coded in the input signal is any of 0 to 3, which are specified integers, the code corresponding to that specified integer registered in Table 1 is selected and output. For example, the code corresponding to the integer value 3, which is a specified integer, is 1110.

The code corresponding to a non-specified integer p=6 is 1111 110, which is a combination of the extension code 1111 and the unary code 110 expressing the integer p−4.

In the example of Table 2 (see FIG. 22), two extension codes 11110 and 11111 are specified. The coding method corresponding to the extension code 11110 is unary coding, and the coding method corresponding to the extension code 11111 is a combination of fixed-length coding and Rice coding. The combination of the extension code and the corresponding coding method is previously uniquely determined in the coding apparatus and the decoding apparatus.

The code "code (U, p−4)" in this example is a code resulting from the coding method corresponding to the extension code 11110 or, more specifically, a code obtained by unary coding of an integer p minus 4 (p−4) when the integer value to be coded is the non-specified integer p. The code "code (F, g, s−1)‖code (R, s, p−4)" is a code resulting from the coding method corresponding to the extension code 11110 or, more specifically, a combination of a g-bit fixed-length code "code (F, g, s−1)" of the Rice parameter s and a code "code(R, s, p−4)" of the integer p−4 obtained by Golomb-Rice coding with the Rice parameter s when the integer value to be coded is the non-specified integer p. It is assumed that p≥4. For the number W of the possible values of the Rice parameter s, a relation holds: $g=\lceil \log_2 W \rceil$. As for the code "code(R, s, p−4)", the lower-significant s bits of a binary expression of the integer p−4 are output, and then, a unary code of the quotient (p−4)/(2^s) is output. This order of output is previously uniquely determined in a coding processing part and a decoding processing part.

For example, if the Rice parameter s is set to fall within a range 1≤s≤4, g=2, and the code of the non-specified integer p=12 is
11110 111111110,
11111 00 011110 (s=1; 2-bit code 00),
11111 01 00110 (s=2; 2-bit code 01),
11111 10 00010 (s=3; 2-bit code 10), or
11111 11 10000 (s=4; 2-bit code 11).

In the case where two or more extension codes are specified, at least two codes result for a non-specified integer, and the one with the shortest code length of the resulting codes is adopted as the code of the non-specified integer (in the example described above, any of the codes can be adopted because the code length is the same whether s=2, 3, or 4. For example, the code for s=2, which is the first entry, is used).

In the example of Table 3 (see FIG. 23), four extension codes 111100, 111101, 111110, and 111111 are specified. The code "code(U, p−4)" is a code obtained by unary coding of an integer p−4. The code "code(F, g, s−3)" is a g-bit fixed-length code of the Rice parameter s. For the number W of the possible values of the Rice parameter s, a relation holds: $g=\lceil \log_2 W \rceil$. The code "code(R, s, p−4)" is a code of the integer p−4 obtained by Golomb-Rice coding with the Rice parameter s. It is assumed that p≥4. In the case where the extension code is 111101, the Rice parameter s is fixed at 1. In the case where the extension code is 111110, the Rice parameter s is fixed at 2.

In this example, in the case where the extension code is 111111, the Rice parameter s can assume four values falling within a range 3≤s≤6, an integer s−3 is expressed by a 2-bit fixed-length code "code(F, g, s−3)" (g=2), and the fixed-length code "code(F, g, s−3)" and a code "code(R, s, p−4) of the integer p−4 obtained by Golomb-Rice coding with the Rice parameter s are combined. For example, the code of an integer p=12 is
111100 111111110,
111101 011110 (s=1),
111110 00110 (s=2),
111111 00 00010 (s=3; 2-bit code 00),
111111 01 10000 (s=4; 2-bit code 01),
111111 10 001000 (s=5; 2-bit code 10), or
111111 11 0001000 (s=6; 2-bit code 11).

In the case where two or more extension codes are specified, at least two codes result for a non-specified integer, and the one with the shortest code length of the resulting codes is adopted as the code of the non-specified integer.

In the example of Table 4 (see FIG. 24), two extension codes 11110 and 11111 are specified. The code "code(U, p−4: 4≤p≤6)" is a code obtained by unary coding of an integer p−4 (4≥p≥6). The code "code(U, p−12: 15≤p)" is a code obtained by unary coding of an integer p−12 (15≤p). The code "code(F, h, p−7: 7≤p≤14)" is a h-bit code of an integer p−7 obtained by fixed-length coding. For the number Q of the possible values of the integer p, a relation holds: $h=\lceil \log_2 Q \rceil$. In the case where the integer p falls within a range 7≤p≤14, h=3. The example of Table 4 is an improvement of the code table shown in Table 1 and is designed so that shorter codes are assigned to smaller integers if the smaller the integers are, the higher the appearance frequency (appearance probability) is. For example, the code of an integer p (4≤p≤19) is
11110 0 (p=4),
1111010 (p=5),
11110110 (p=6),
11111 000 (p=7),
11111 001 (p=8),
11111010 (p=9),
11111 011 (p=10),
11111 100 (p=11),
11111 101 (p=12),
11111110 (p=13),
11111 111 (p=14),
11110 1110 (p=15),
11110 11110 (p=16),
11110 111110 (p=17),
11110 1111110 (p=18), and
11110 11111110 (p=19).

In the example of Table 5 (see FIG. 25), three extension codes 111101, 111110, and 111111 are specified. The code "code(U, p−5)" is a code obtained by unary coding of an integer p−5. The code "code(F, 3, p−5)" is a 3-bit code of the integer p−5 obtained by fixed-length coding. The code "code (F, 4, p−5)" is a 4-bit code of the integer p−5 obtained by fixed-length coding. It is assumed that p≥5.

In the example of Table 6 (see FIG. 26), two extension codes 1110 and 110 are specified. The code "code(U, p−3: p=3)" is a code 0 of an integer p−3 obtained by unary coding. The code "code(U, p−4: 5≤p)" is a code of an integer p−4 obtained by unary coding (5≤p). The code "code(F, 3, p−4: 5≤p)" is a 3-bit code of the integer p−4 obtained by fixed-length coding (5≤p). Although the code of the non-specified integer p has a longer code length than the code of the specified integer in the examples of Tables 1 to 5, the code length of the code assigned to the non-specified integer p may be equal to or shorter than the code length of the specified integer as shown in the example of Table 6. If the appearance frequency of the non-specified integer is higher than the appearance frequency of the specified integer, a code table in which the extension code corresponding to the non-specified integer has a shorter code length is used. The code table is designed based on statistical expectation values of the appearance frequency measured previously.

Summary of Decoding According to Embodiment 1 of Invention

In decoding according to the embodiment 1 of the present invention, the code sequence resulting from coding according to the embodiment 1 is used as an input to produce the original integer value sequence.

A code in the code sequence is obtained by variable-length coding corresponding to the original integer value, and the original integer sequence is produced by successively decoding the codes from the leading code.

Figure 3:
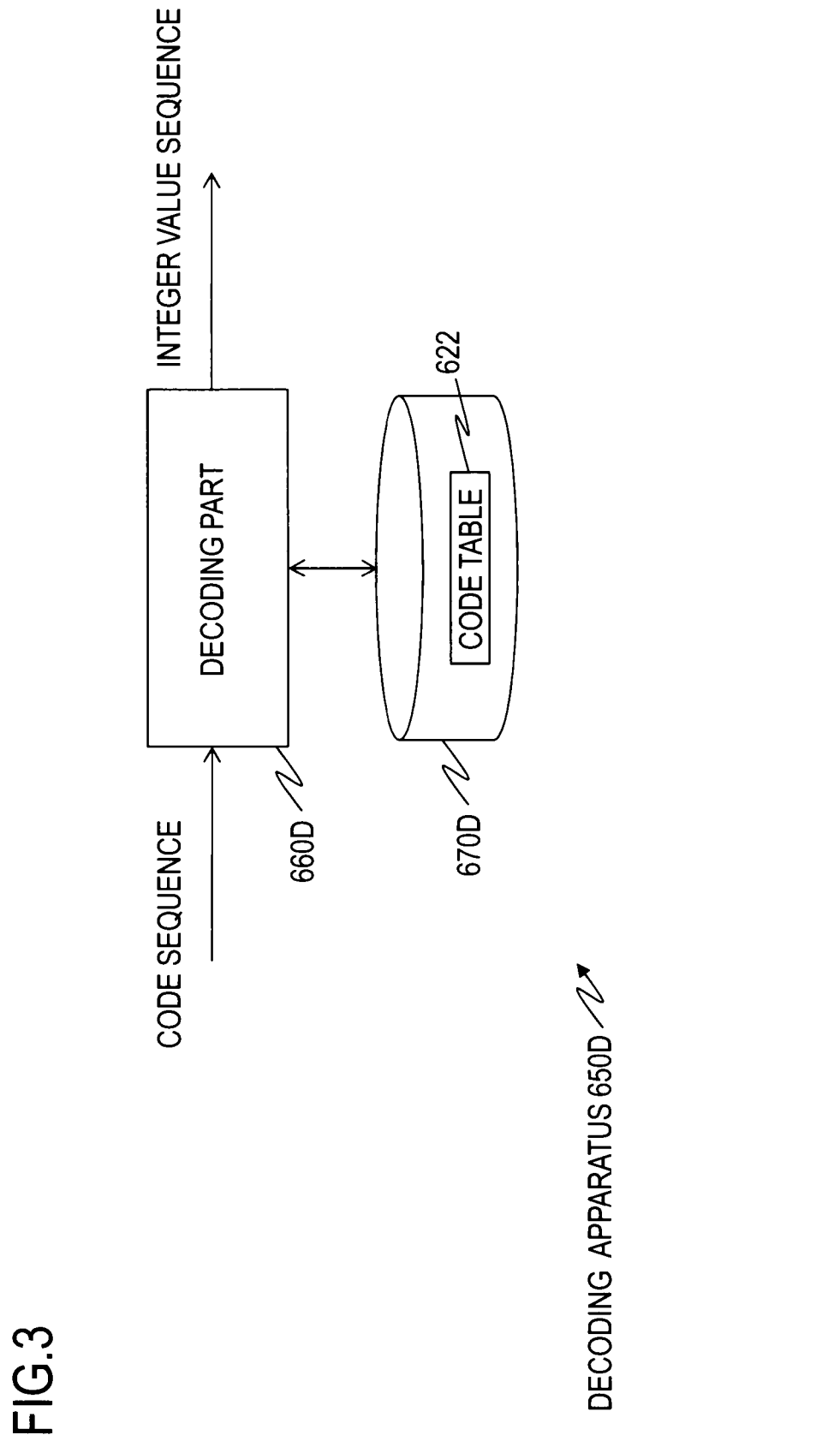
FIG. 3 is a block diagram showing an exemplary functional configuration of a decoding apparatus according to the embodiment 1.

FIG. 3 shows an exemplary functional configuration of a decoding apparatus 650D according to the embodiment 1.

The decoding apparatus 650D comprises a storage part 670D that stores the code table 622, and a decoding part 660D that receives a cod sequence as an input, performs decoding using the code table 622, and outputs the resulting integer value sequence.

Figure 4:
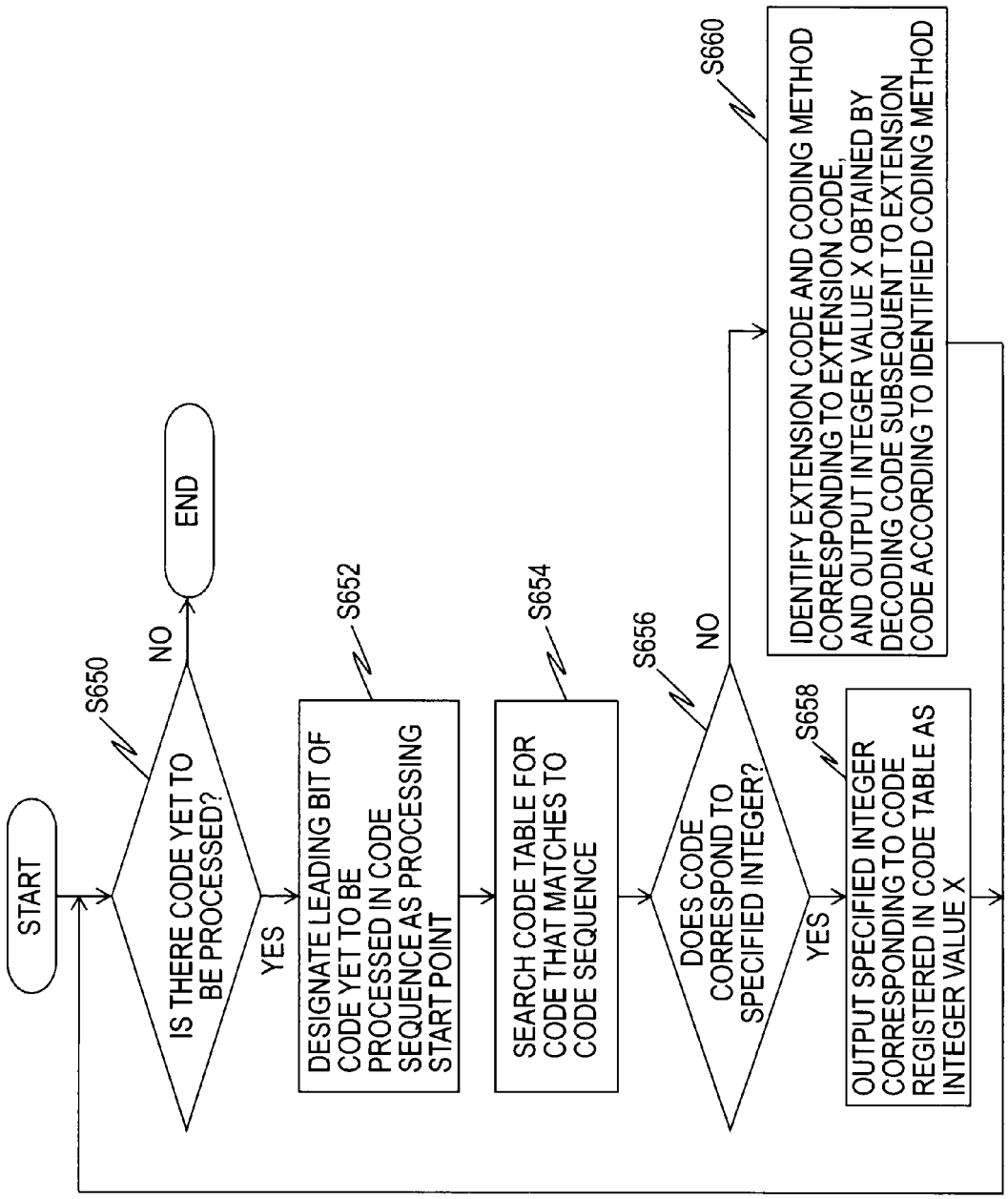
FIG. 4 is a diagram showing a flow of a decoding process according to the embodiment 1.

FIG. 4 shows a decoding procedure.

First, it is determined whether or not there is a code yet to be processed (step S650). If there is no such a code, the procedure is ended. If there is such a code, the leading bit of the code yet to be processed is designated as a processing start point (step S652). Then, the code table 622 is searched for a code that matches to the code sequence (step S654). Then, it is determined whether or not the code corresponds to the specified integer (step S656). If the code corresponds to the specified integer, the specified integer corresponding to the code registered in the code table 622 is output as the integer value X (step S658). If the code does not correspond to the specified integer, the extension code and the coding method corresponding to the extension code are identified, and the integer value X obtained by decoding the code subsequent to the extension code according to the identified coding method is output (step S660).

That is, beginning with the leading bit of the code sequence, the code bits are successively read in until the code corresponding to the specified integer recorded in the code table or the extension code is identified.

If the code read in matches to the code corresponding to the specified integer, the specified integer corresponding to the code is output as the integer value resulting from decoding.

If the code read in is the extension code, the code according to the coding method previously uniquely determined for the extension code is read from the code sequence subsequent to the extension code and decoded, and the resulting integer value is output.

For example, consider a case where the original integer sequence is reproduced by decoding the following input code sequence that is formed using Table 2 (see FIG. 22) where g=2:
0101111010111110101 10

According to the steps in FIG. 4, beginning with the leading bit of the codes yet to be processed, the bits of the codes are checked to find a code that matches to a code recorded in Table 2. From Table 2, the input code sequence is analyzed as follows.
0, 10, 11110||10, 11111||01||01 10

Thus, the integer value sequence resulting from the decoding is 0, 1, 5, 5, 9.

Summary of Coding According to Embodiment 2 of Invention

Figure 5:
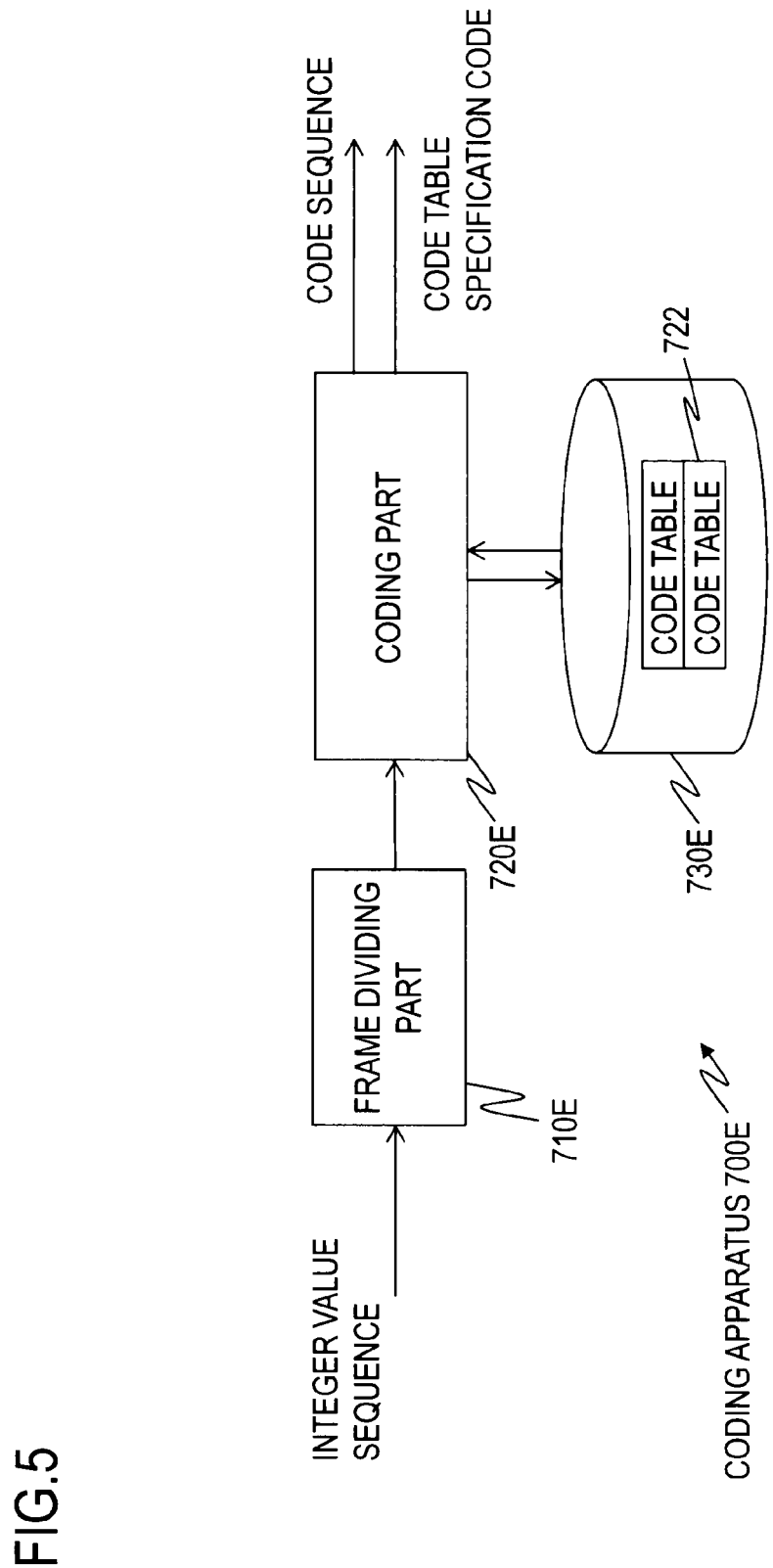
FIG. 5 is a block diagram showing an exemplary functional configuration of a coding apparatus according to an embodiment 2.

FIG. 5 shows an exemplary functional configuration of a coding apparatus 700E according to an embodiment 2 of the present invention.

The coding apparatus 700E comprises a storage part 730E that stores a plurality of code tables 722, a frame dividing part 710E that receives an integer value sequence as an input and outputs frames of a predetermined number of samples, and a coding part 720E that receives the frames of samples as an input, codes the frames of samples using the code tables 722, and outputs a code sequence and a code table specification code.

Figure 6:
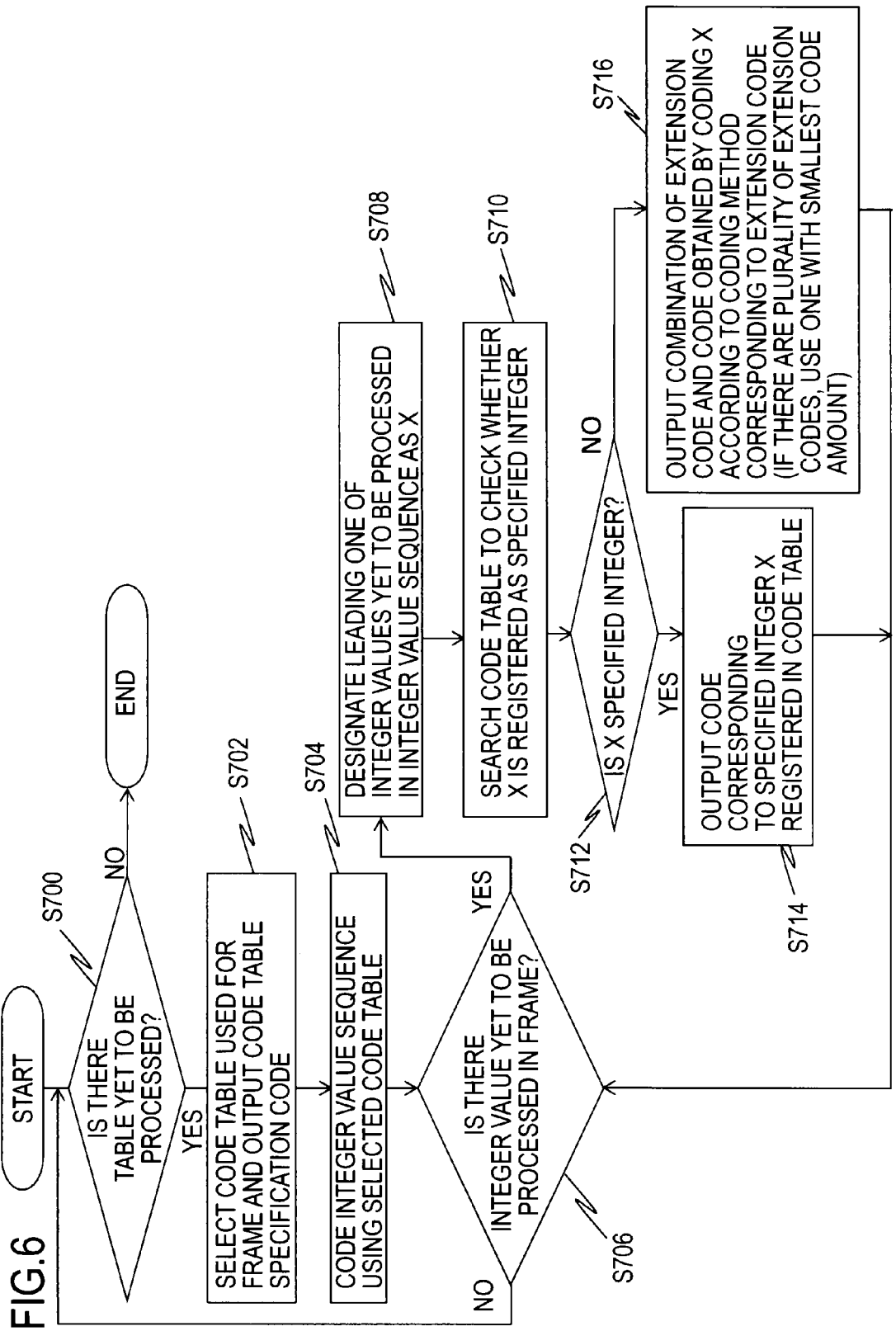
FIG. 6 is a diagram showing a flow of a coding process according to the embodiment 2.

FIG. 6 shows a coding process.

First, it is determined whether or not there is a frame yet to be processed (step S700). If there is no such a frame, the process is ended. If there is such a frame, a code table used for the frame is selected, and the code table specification code is output (step S702). In this step, the amount of codes resulting from coding of the integer value sequence is estimated for each code table, and the code table that provides the smallest code amount is selected. Alternatively, a code table may be selected based on the estimated code amount for each code table. Then, the integer value sequence is coded using the selected code table (step S704). It is determined whether or not there is an integer value yet to be processed in the frame (step S706). If there is no integer value yet to be processed in the frame, the processing in step S700 is performed. If there is an integer value yet to be processed in the frame, the leading one of the integer values yet to be processed in the integer value sequence is designated as X (step S708). Then, the code table 722 is searched to check whether or not X is registered in the code table 722 as the specified integer (step S710). It is determined whether or not X is the specified integer (step S712). If X is the specified integer, the code corresponding to the specified integer X registered in the code table 722 is output (step S714). If X is not the specified integer, a combination of an extension code and a code obtained by coding X according to the coding method corresponding to the extension code is output (if there are a plurality of extension codes, the one with the smallest code amount is used) (step S716). Following step S714 or 716, the processing in step S706 is performed.

The embodiment 2 differs from the embodiment 1 in that the integer values in the input integer value sequence are processed, beginning with the leading integer value, in units of frames each including a predetermined number of integer values, that a plurality of code tables are provided, and a code table that provides the smallest code amount is selected on a frame basis, and that the code table specification code that identifies the selected code table is output for each frame.

Summary of Decoding According to Embodiment 2 of Invention

Figure 7:
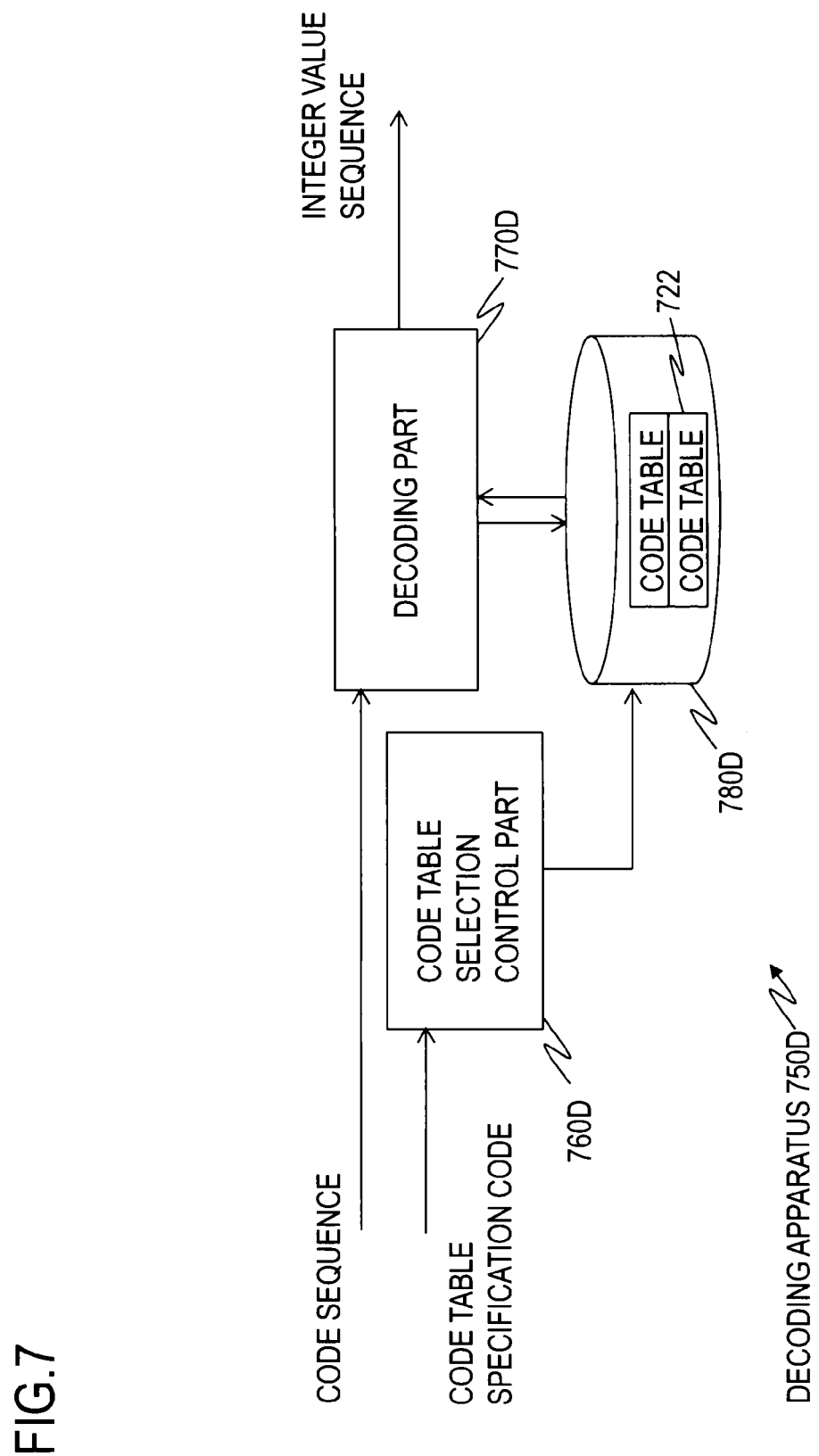
FIG. 7 is a block diagram showing an exemplary functional configuration of a decoding apparatus according to the embodiment 2.

FIG. 7 shows an exemplary functional configuration of a decoding apparatus 750D according to the embodiment 2 of the present invention.

The decoding apparatus 750D comprises a storage part 780D that stores a plurality of code tables 722, a code table selection control part 760D that receives a code table specification code as an input and controls selection from among the code tables 722, and a decoding part 770D that receives a code sequence as an input, decodes the code sequence using the code tables 722, and outputs an integer value sequence.

Figure 8:
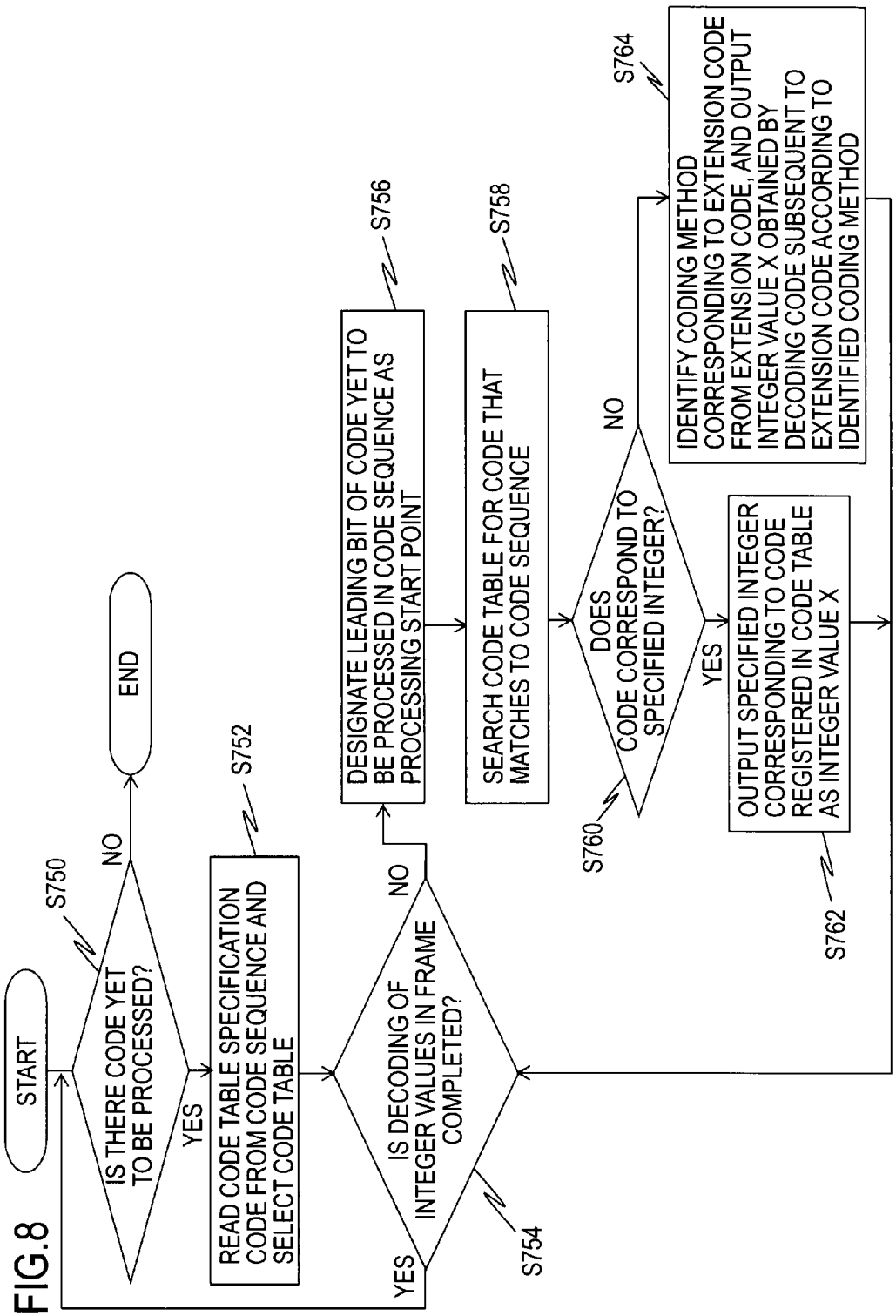
FIG. 8 is a diagram showing a flow of a decoding process according to the embodiment 2.

FIG. 8 shows a decoding process.

First, it is determined whether or not there is a code yet to be processed (step S750). If there is no such a code, the process is ended. If there is such a code, the code table specification code is read in from the code sequence to select a code table (step S752). Then, it is determined whether or not decoding of the integer values in the frame is completed (step S754). If the decoding is completed, the processing in step S750 is performed. If the decoding is not completed, the leading bit of the code yet to be processed in the code sequence is designated as a processing start point (step S756). Then, the code table 722 is searched for a code that matches to the code sequence (step S758). It is determined whether or not the code corresponds to the specified integer (step S760). If the code corresponds to the specified integer, the specified integer corresponding to the code registered in the code table 722 is output as the integer value X (step S762). If the code does not correspond to the specified integer, an extension code and the coding method corresponding to the extension code are identified, and the integer value X obtained by decoding the code subsequent to the extension code according to the identified coding method is output (step S764).

The decoding process according to the embodiment 2 is performed on a frame basis.

The embodiment 2 differs from the embodiment 1 in that the code table specification code is first decoded, and the subsequent decoding is performed using the specified code table (or a decode table corresponding to the code table).

Beginning with the leading bit of the code sequence, the code bits are successively read in until the code corresponding to the specified integer recorded in the code table or the extension code is identified.

The embodiment 2 is the same as the embodiment 1 in that when the code read in matches to the code corresponding to the specified integer, the specified integer corresponding to the code is output as the integer value resulting from the decoding.

Summary of Coding According to Embodiment 3 of Invention

An embodiment 3 described below is a combination of the embodiments 1 and 2 described above and a coding method similar to the Golomb-Rice coding.

It is assumed that an input signal handled in this embodiment is a signal obtained by coding an audio signal according to a coding method. However, each sample in the input signal is expressed as an integer. The ITU-T G. 711 disclosed in Non-patent literature 1 described above is an example of such a coding method. The input signal is not limited to the signal obtained by coding an audio signal according to a coding method itself (the original signal) but may be a linear prediction residual obtained by performing a linear prediction analysis of the original signal, for example.

A coding apparatus codes the input signal on a frame basis. First, a separation parameter calculation part of the coding apparatus determines a separation parameter B for each sample in one frame of the input signal from the frame of the input signal. The separation parameter B can be determined in various ways. For example, in the embodiment 3, the separation parameter B is determined by a method similar to the method used for determining the Rice parameter in Golomb-Rice coding.

Calculation of the Rice parameter s will be described. The Rice parameter s is determined so as to minimize the length of the code obtained by Golomb-Rice coding of each sample in one frame of the input signal (that is, the total code length of the Golomb-Rice codes for the samples). If the input signal is obtained according to the ITU-T G. 711 coding method, for example, each sample in the input signal may be expressed as a positive or negative integer. In the case where each sample is expressed as a positive or negative integer, the Rice parameter s is determined so as to minimize the length of the code obtained by coding each sample in one frame of the input signal converted into an integer equal to or greater than 0 (that is, the total code length of the Golomb-Rice codes for the samples). In the example described below, it is assumed that each sample in the input signal is expressed as a positive or negative integer.

For samples $x_i$ (i=1, 2, ..., N; N represents the number of samples included in one frame) included in the input signal, a quotient $q_i$ for the sample $x_i$ converted into an integer equal to or greater than 0 is calculated using the Rice parameter s according to the following formula (3) or (4). In the case where the quotient $q_i$ is determined according to the formula (3), the code that expresses the remainder is an s-bit fixed-length code including an s–1-bit binary code expressing the remainder and a 1-bit code that indicates whether the sample $x_i$ is positive or negative. In the case where the quotient $q_i$ is determined according to the formula (4), the least significant bit (LSB) of the code that expresses the quotient $q_i$ indicates whether the sample $x_i$ is positive or negative.

The case where $s \geq 1$:

$$q_i = \begin{cases} \lfloor \frac{x_i}{2^{s-1}} \rfloor = \lfloor \frac{2x_i}{2^s} \rfloor & (x_i \geq 0) \\ \lfloor \frac{-x_i - 1}{2^{s-1}} \rfloor = \lfloor \frac{-2x_i - 2}{2^s} \rfloor & (x_i < 0) \end{cases} \quad (3)$$

The case where s=0:

$$q_i = \begin{cases} \lfloor 2x_i \rfloor = \lfloor \frac{2x_i}{2^s} \rfloor & (x_i \geq 0) \\ \lfloor -2x_i - 1 \rfloor = \lfloor \frac{-2x_i - 1}{2^s} \rfloor & (x_i < 0) \end{cases} \quad (4)$$

The code length C of the code that expresses the sample $x_i$ is determined according to the following formula (5), where the character "a" represents 0, 1, or 2. The symbol |●| represents the absolute value. The sum of the first term and the second term in the formula (5) represents the code length of the unary code of the quotient $q_i$, and the third term represents the code length of the binary code that expresses the remainder.

$$C = \lfloor \frac{2|x_i| - a}{2^s} \rfloor + 1 + s \quad (5)$$

Therefore, the code length of the input signal converted into integers equal to or greater than 0, that is, the sum C(s, $x_i$, N) of the code lengths of the Golomb-Rice codes for the samples converted into integers equal to or greater than 0 is determined according to the following formula (6). The character "D" in the formula (6) represents a value defined by the formula (7).

$$C(s, x_i, N) = \sum_{i=1}^{N} \left\{ \left\lfloor \frac{2|x_i| - a}{2^s} \right\rfloor + 1 + s \right\} \quad (6)$$

$$= \frac{1}{2^s}(2D - aN) + (1+s)N$$

$$D = \sum_{i=1}^{N} |x_i| \quad (7)$$

The Rice parameter s that minimizes the code length $C(s, x_i, N)$ (referred to as $s_0$ hereinafter) can be determined by solving the formula (8) with respect to s. In short, $s_0$ is given by the formula (9). The symbol "ln" represents natural logarithm. The desired Rice parameter s is determined according to $s = \lfloor s_0 \rfloor$ or $s = \lceil s_0 \rceil$. The symbol "$\lceil \cdot \rceil$" represents a ceiling function. To avoid degradation of the processing speed due to the numerical calculation, values of $s_0$ may be previously determined for various combinations of D, N and a, and a table that associates the values of s with the combinations of D, N and a may be stored in the storage part. In that case, once the values D, N and a are determined, the Rice parameter s can be determined from the table, so that degradation of the processing speed can be avoided. For a combination of D, N and a that is not contained in the table, $s_0$ can be determined by numerical calculation.

$$\frac{\partial C(s, x_i, N)}{\partial s} = -\frac{\ln 2}{2^s}(2D - aN) + N = 0 \quad (8)$$

$$s_0 = \log_2 \left( \ln 2 \cdot \left( \frac{2D}{N} - a \right) \right) \quad (9)$$

If D/N is sufficiently larger than a, the formula (9) can be rewritten as the formula (10).

$$s_0 = \log_2 \left( \ln 2 \cdot \frac{2D}{N} \right) \quad (10)$$

The minimum value $C(x_i, N)$ of the code length $C(s, x_i, N)$ of the Rice code for the frame is given by the following formula (11).

$$C(x_i, N) = N \left[ \frac{1}{\ln 2} + 1 + \log_2 \left( \ln 2 \cdot \left( \frac{2D}{N} - a \right) \right) \right] \quad (11)$$

In summary, the separation parameter calculation part determines the separation parameter B by determining the Rice parameter $s = \lfloor s_0 \rfloor$ or $s = \lceil s_0 \rceil$ from one frame of the input signal according to the formula (9) or (10).

Once the separation parameter B is determined, a division remainder calculation part of the coding apparatus converts each sample in one frame of the input signal into an integer equal to or greater than 0, and determines the quotient $y_i$ and the remainder $z_i$. The quotient $y_i$ is calculated according to the formula (12) or (13), depending on the separation parameter B. In the case where B=0, the divisor is $2^0=1$. Therefore, the calculation of the quotient $y_i$ is effectively equivalent to a processing of replacing a sample $x_i$ equal to or greater than 0 with an even number or replacing a negative sample $x_i$ with an odd number.

The case where B≥1:

$$y_i = \begin{cases} \left\lfloor \frac{x_i}{2^{B-1}} \right\rfloor & (x_i \geq 0) \\ \left\lfloor \frac{-x_i - 1}{2^{B-1}} \right\rfloor & (x_i < 0) \end{cases} \quad (12)$$

The case where B=0:

$$y_i = \begin{cases} 2x_i & (x_i \geq 0) \\ -2x_i - 1 & (x_i < 0) \end{cases} \quad (13)$$

The remainder $z_i$ is determined according to the following formula (14). In the case where B=0, no remainder $z_i$ results.

$$z_i = \begin{cases} x_i - \left\lfloor \frac{x_i}{2^{B-1}} \right\rfloor \cdot 2^{B-1} & (x_i \geq 0) \\ -x_i - 1 - \left\lfloor \frac{-x_i - 1}{2^{B-1}} \right\rfloor \cdot 2^{B-1} & (x_i < 0) \end{cases} \quad (14)$$

The remainder $z_i$ is expressed as a B-bit binary code. In the case where the quotient $y_i$ is determined according to the formula (12), although the remainder $z_i$ itself is expressed as a B–1-bit binary code, one bit that indicates whether the sample $x_i$ is positive or negative is added to the B–1-bit binary code to form the B-bit binary code. For example, the one bit that indicates the sign of the sample $x_i$ is the most significant bit (MSB) of the binary code that expresses the remainder $z_i$, and the one bit represents 1 if the sample $x_i$ is equal to or greater than 0 or represents 0 if the sample $x_i$ is smaller than 0.

A quotient coding part of the coding apparatus codes the quotient $y_i$ using at least one code table. The code table is a database in which (1) a combination of an integer and a code corresponding to the integer and (2) a combination of a set of integers other than the integer specified in the combination described above and at least one code corresponding to the set (referred to as an extension code hereinafter) are recorded. The integers are equal to or greater than 0. In the following description, the integer specified in the combination specified in the combination (1) will be referred to as a specified integer, the integers other than the specified integer will be referred to as a non-specified integer, and a coding method corresponding to the extension code will be referred to as an extension coding method.

The quotient coding part searches the code table. If the quotient y corresponds to any specified integer, the quotient coding part outputs the code corresponding to the specified integer. If the quotient y corresponds to a non-specified integer, the quotient coding part combines the extension code and a code of the non-specified integer p obtained according to a predetermined coding method corresponding to the extension code and outputs the resulting code.

The specified integers and the codes corresponding to the specified integers shown in the exemplary code tables shown in Tables 1 to 6 described above are given only for illustrative purposes. The specified integers and the corresponding codes are preferably set by learning with a previously prepared input signal (learning input signal). For example, quotients for the samples of a learning input signal converted into integers equal to or greater than 0 using a Rice parameter s determined from the learning input signal are determined, and Huffman codes for the quotients are produced. Of these quotients, those that appear with high frequencies (high probabilities) and the Huffman codes therefor are adopted as the specified integers and the codes therefor. The extension code can be any binary code different from the codes for the specified integers and can be arbitrarily set. The coding method corresponding to the extension code can also be arbitrarily set.

The Rice parameter s used for the learning is not limited to the Rice parameter s determined from the learning input signal. As an alternative, two or more parameters s arbitrarily determined (which are preferably values close to the Rice parameter s determined from the learning input signal) may be used, and quotients for the samples of the learning input signal converted into integers equal to or greater than 0 and codes therefor (Huffman codes, for example) may be produced for each parameter s, so that a plurality of code tables may be produced from one learning input signal.

The Rice parameter s determined from the learning input signal and the appearance frequency (appearance probability) of the quotient of each sample of the learning input signal depend on the statistical characteristics of the learning input signal, and thus, a plurality of learning input signals may be prepared, and a plurality of code tables may be produced from each learning input signal.

If the statistical characteristics of the input signal to be coded is known, one code table produced from a learning input signal having the same or similar statistical characteristics as or to the statistical characteristics of the input signal will suffice. However, if the statistical characteristics of the input signal to be coded is unknown or expected to vary, a plurality of code tables are preferably produced from a plurality of learning input signals.

Depending on the statistical characteristics of the input signal, there may be a strong correlation between the MSB of the remainder z coded into an s-bit binary code and the LSB of the quotient y. In such a case, the MSB of the remainder z is preferably included in the quotient y before coding. Thus, when the Rice parameter determined from the learning input signal is s ($s \geq 1$), s−1 is regarded as a Rice parameter, and the quotient y and the remainder z for each sample of the learning input signal converted into an integer equal to or greater than 0 are determined. In this case, the code length of the remainder z is reduced to s−1 bits. On the other hand, the code length of the quotient y expressed as a binary code would otherwise increase by 1. However, the code length of the quotient y does not necessarily increase if Huffman coding is applied to the quotient y, for example. In addition, the value of the quotient y is twice as large as that in the case where the Rice parameter is s, so that the number of specified integers can also double. Even if this occurs, the code length of the code corresponding to the specified integer does not double. The one bit (0, 1) that is saved by reducing the code length of the remainder z can be added to the codes corresponding to the specified integers to double the number of specified integers. For example, if one bit is added to the codes corresponding to the specified integers in the example of Table 1, eight specified integers from 0 to 7 can be handled as shown in Table 7 (see FIG. 27) (the code corresponding to the specified integer 7 comprises 5 bits, rather than 8 bits (4 bits by 2)). Furthermore, depending on the appearance frequency (appearance probability) of the quotient y, there may be no need to specify twice as many specified integers as the number of specified integers in the case of the Rice parameter s, and the number of specified integers may be fewer than twice the number of the specified integers in the case of the Rice parameter s as shown in the example of Table 8 (see FIG. 28). In this case, compared with the example of Table 1, the code length of the code expressing the remainder z is one bit shorter, although the code length of the codes corresponding to the specified integers remains 4 bits.

<Coding Process>

Figure 17:
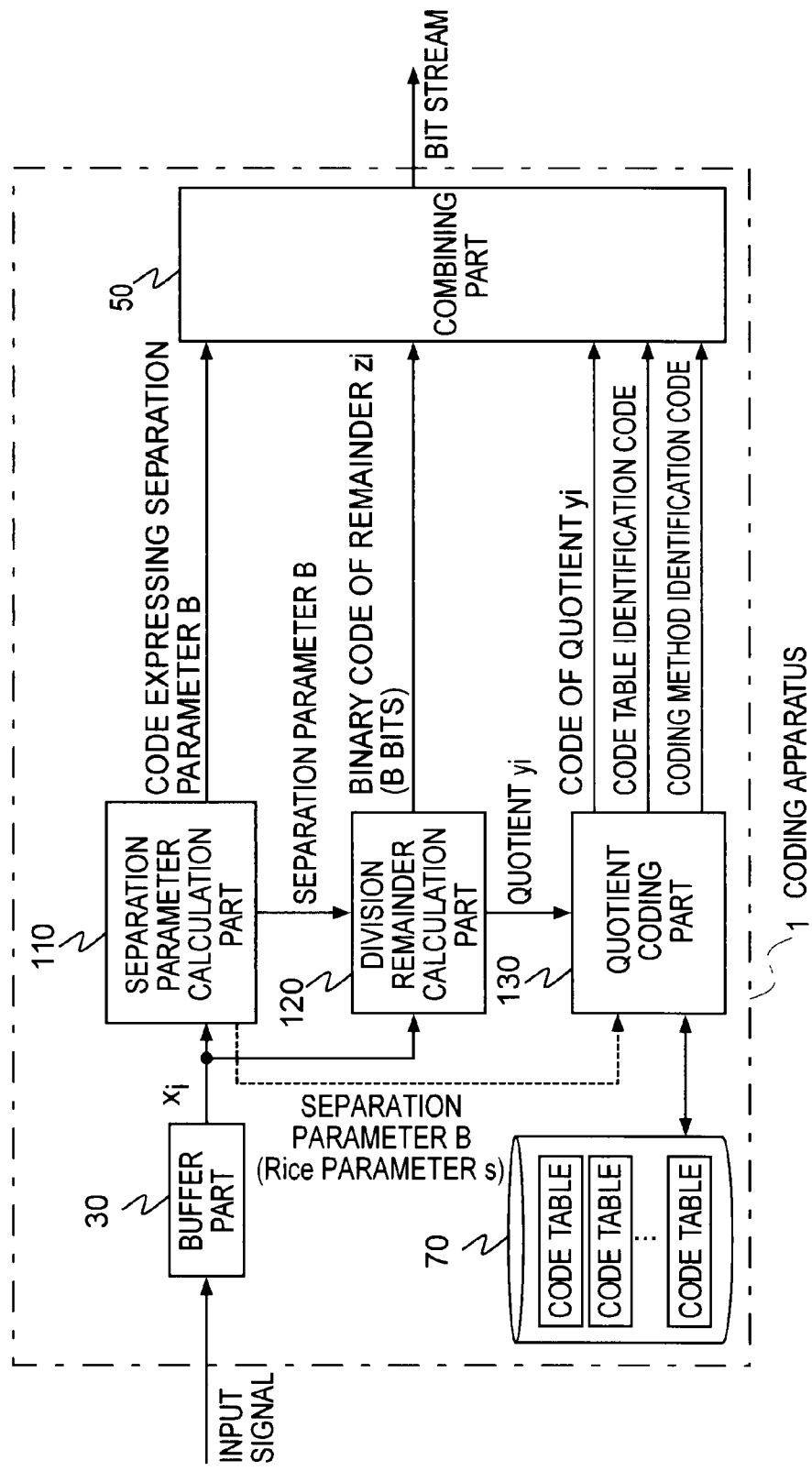
FIG. 17 is a block diagram showing an exemplary functional configuration of a coding apparatus according to an embodiment 3.
Figure 18:
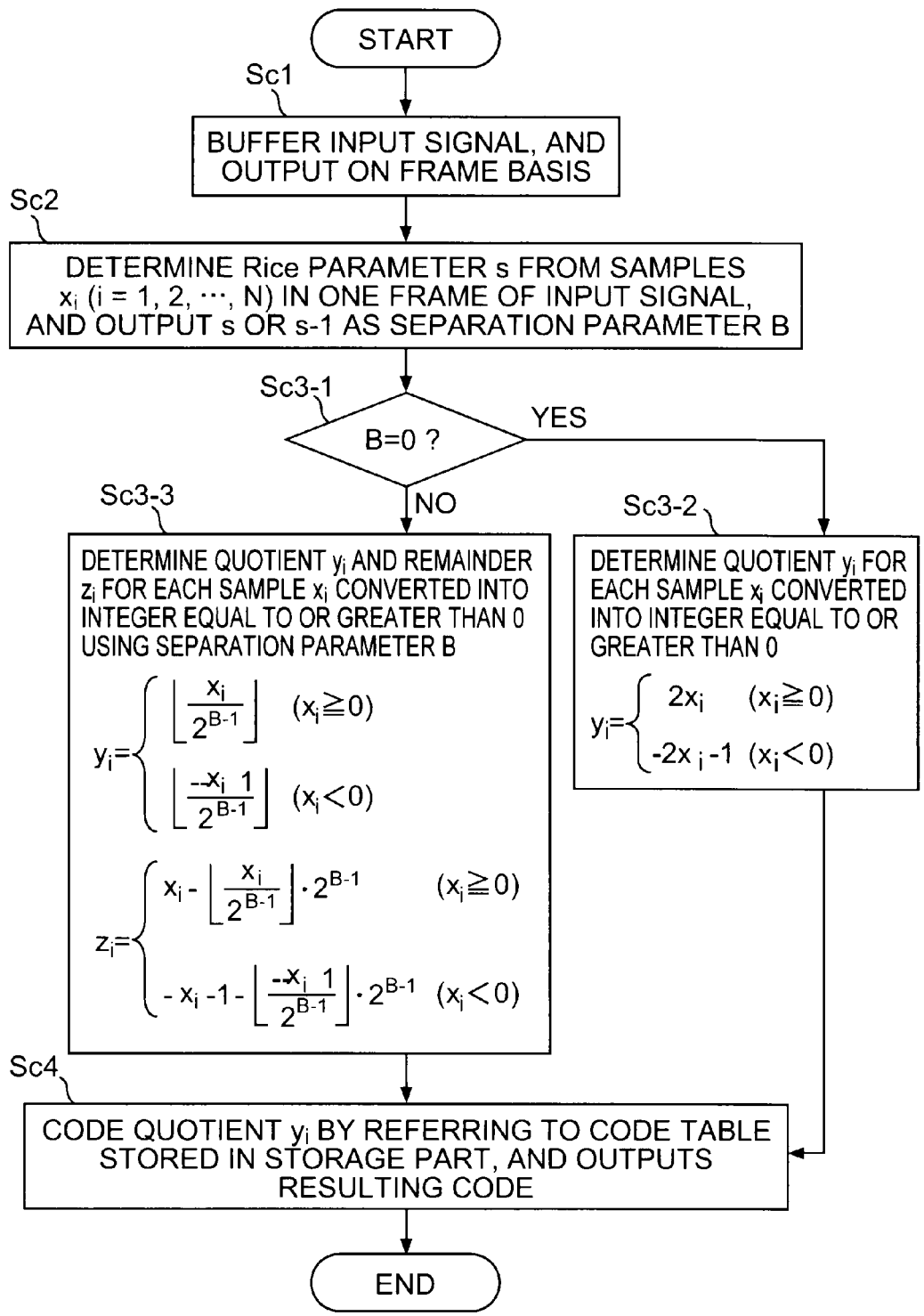
FIG. 18 is a diagram showing a flow of a coding process according to the embodiment 3.

Next, with reference to FIGS. 17 and 18, a flow of a coding process performed by the coding apparatus 1 will be described.

[Step Sc1]

A buffer part 30 of the coding apparatus 1 buffers an input signal and outputs the input signal in units of frames.

[Step Sc2]

A separation parameter calculation part 110 of the coding apparatus 1 determines the Rice parameter $s = \lfloor s_0 \rfloor$ or $s = \lceil s_0 \rceil$ from samples $x_i$ (i=1, 2, . . . , N) of one frame of the input signal according to the formula (9) or (10). Then, the separation parameter calculation part 110 adopts the determined s or s−1 as a separation parameter B and outputs a code that expresses the separation parameter B. In the case where s−1 is used as the separation parameter B, it is assumed B=0 when s=0.

Supposing that the possible range of the value of the separation parameter B is $0 \leq B \leq 7$, for example, the code expressing the separation parameter B may express the value from 0 to 7 in the form of a 3-bit code or a positive integer value or may be a unique code that becomes shorter as the appearance frequency or appearance probability of the value of the separation parameter B becomes higher.

In the latter case, if the values 2 and 3 have the highest appearance probability, for example, the value of the separation parameter B can be uniquely determined by configuring the coding apparatus and the decoding apparatus so as to use the common Huffman codes described below for coding and decoding.

B=0: 100
B=1: 101
B=2: 00
B=3: 01
B=4: 110
B=5: 1110
B=6: 11110
B=7: 11111

Alternatively, the method disclosed in Japanese patent application No. 2009-056017 (International Application No. PCT/JP2010/053676) may be used for coding of the separation parameter B.

[Step Sc3]

A division remainder calculation part 120 of the coding apparatus 1 determines the quotient $y_i$ and the remainder $z_i$ for each sample of the one frame of the input signal converted into an integer equal to or greater than 0, based on the separation parameter B determined in step Sc2.

The division remainder calculation part 120 first determines whether or not the separation parameter B determined in step Sc2 equals to 0 (step Sc3-1). In the case where B=0, the division remainder calculation part 120 determines the quotient $y_i$ for each sample $x_i$ of the one frame of the input signal converted into an integer equal to or greater than 0 according to the formula (13) (step Sc3-2). In this case, the remainder $z_i$ is not calculated. In the case where $B \geq 1$, the division remainder calculation part 120 determines the quotient $y_i$ for each sample $x_i$ of the one frame of the input signal converted into an integer equal to or greater than 0 according to the formula (12), and calculates the remainder $z_i$ according to the formula (14) (step Sc3-3). The remainder $z_i$ is expressed by a B-bit binary code including, as the MSB, 1 bit for indicating whether the sample $x_i$ is positive or negative.

[Step Sc4]

A quotient coding part 130 of the coding apparatus 1 codes the quotients $y_i$ determined in step Sc3 with reference to a code table stored in a storage part 70 and outputs codes corresponding to the quotients $y_i$. The codes are determined according to the same procedure as in the embodiment 1.

If there are a plurality of code tables, the quotient coding part 130 codes the quotients $y_i$ using a code table produced using a Rice parameter having the same value as the Rice parameter s used to determine the separation parameter B. In the case where a plurality of code tables are used for coding of the quotients $y_i$, the quotient coding part 130 outputs the code with the shortest code length among the resulting plurality of codes. In this case, the quotient coding part 130 also outputs a code that expresses the code table used for determining the output code (code table identification code). In the case where the storage part stores only one code table, the code table identification code does not have to be output.

In addition to the coding using the code table described above, the quotient coding part 130 may produce codes by applying a coding method that does not involve using a code table to the quotients $y_i$ determined in step Sc3. Examples of the coding method that does not involve using a code table include Golomb coding, Golomb-Rice coding, and unary coding. In this case, of the code produced by the coding that involves using a code table and the code produced by the coding that does not involve using a code table, the quotient coding part 130 outputs the code with the shortest code length. In this case, the quotient coding part 130 also outputs a code that identifies the coding method (coding method identification code) and outputs the code table identification code if the coding method is the coding method that involves using a code table.

A combining part 50 multiplexes the output code and the code table identification code. More specifically, the combining part 50 combines, for each frame, the code expressing the separation parameter B determined for the frame, a bit sequence formed by combining the codes for the quotients of the samples in the frame and the binary codes expressing the remainders, and, if necessary, the code table identification code and the coding method identification code corresponding to the samples in the frame, and outputs a bit stream formed by combining the sets of codes in the order of the frames. The bit stream is input to a separation part 40 shown in FIG. 19. The separation part 40 demultiplexes the bit stream into the code expressing the separation parameter B for each frame, the codes for the samples in each frame, and the code table identification code and the coding method identification code for the samples in each frame, which are output from the coding apparatus 1.

<Decoding Process>

Figure 19:
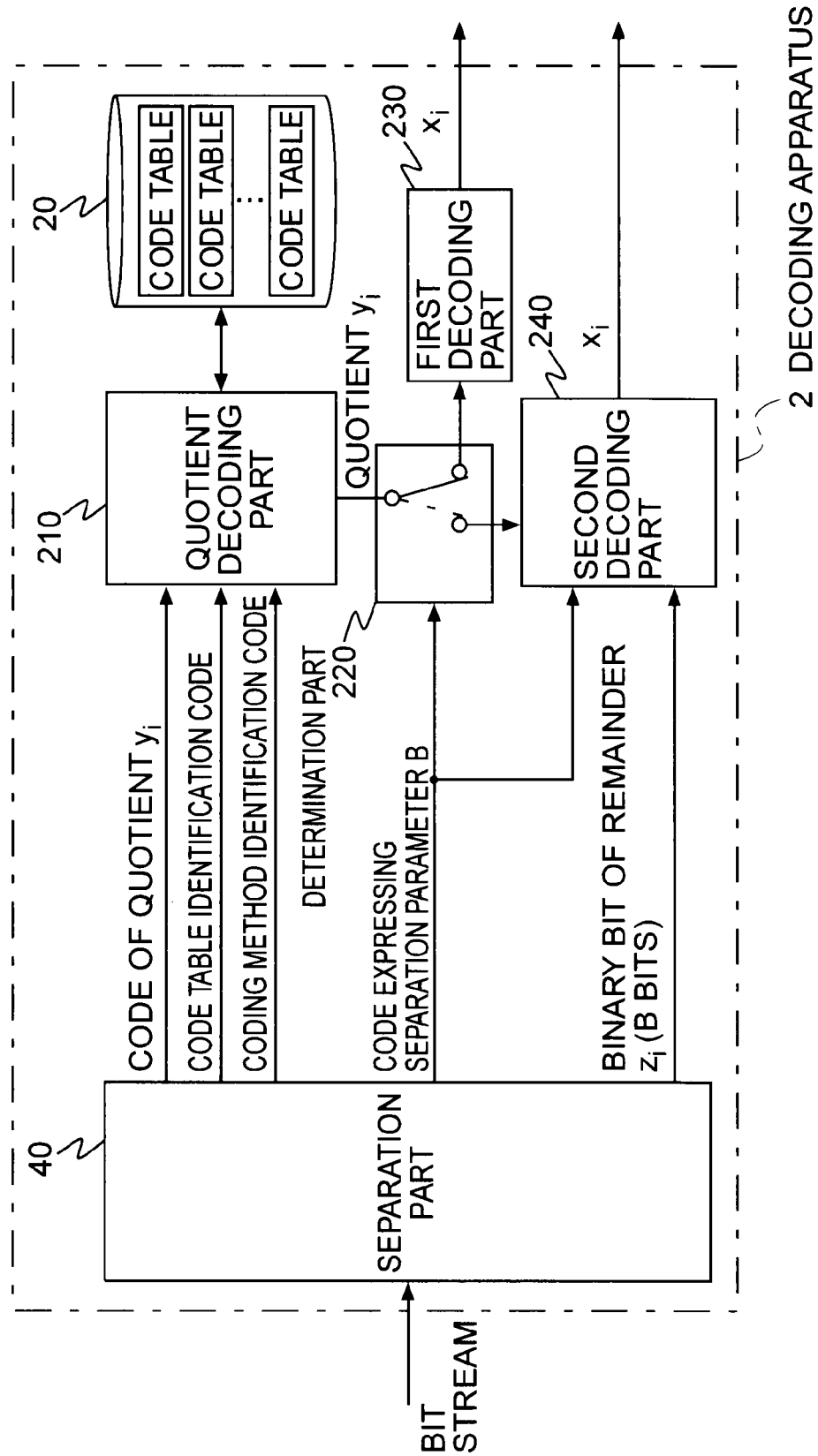
FIG. 19 is a block diagram showing an exemplary functional configuration of a decoding apparatus according to the embodiment 3.
Figure 20:
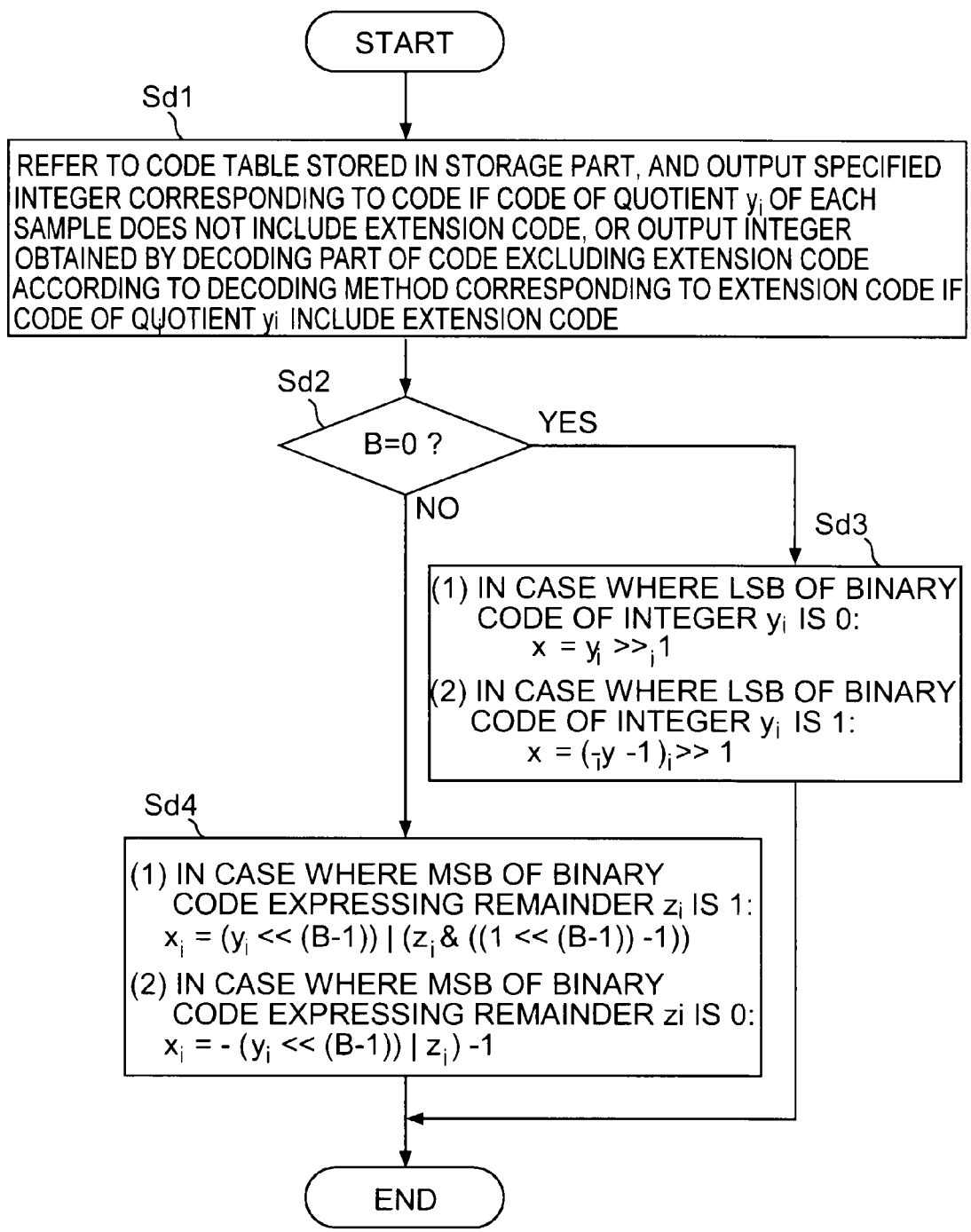
FIG. 20 is a diagram showing a flow of a decoding process according to the embodiment 3.

Next, with reference to FIGS. 19 and 20, a flow of a decoding process performed in a decoding apparatus 2 according to the embodiment 3 of the present invention will be described.

[Step Sd1]

A quotient decoding part 210 of the decoding apparatus 2 decodes the code of the quotient for each sample in the frame transmitted from the separation part 40. The decoding process is a process that uses a code table (the code table identified by the code table identification code in the case where the code table identification code is provided by the separation part 40 or a predetermined code table if the code table identification code is not provided) and outputs the specified integer corresponding to the code if the code of the quotient does not include the extension code or outputs an integer obtained by decoding the code excluding the extension code according to the decoding method corresponding to the predetermined coding method for the extension code if the code of the quotient includes the extension code. The output integer corresponds to the quotient $y_i$.

For example, consider the case where the code table is Table 1. If the code of the quotient $y_i$ is 110, the code of the quotient $y_i$ does not include the extension code 1111, and therefore, the specified integer 2 corresponding to the code 110 is output as the quotient $y_i$. If the code of the quotient y, is 1111 110, the code of the quotient $y_i$ includes the extension code 1111, and therefore, the part 110 of the code 1111 110 excluding the extension code 1111 is decoded according to a decoding method corresponding to the unary coding code(U, p–4) for the extension code 1111, and an integer 6, which is the sum of the resulting integer 2 and 4, is output as the quotient $y_i$. Decoding methods corresponding to the Golomb coding, the Golomb-Rice coding, the unary coding and the like are described in detail in Non-patent literature 3 described above, and detailed descriptions thereof will be omitted herein.

If the coding method identification code is provided by the separation part 40, the quotient decoding part 210 decodes the code of the quotient according to the decoding method corresponding to the coding method identified by the coding method identification code. If the coding method identified by the coding method identification code is a coding method that involves using a code table, the quotient decoding part 210 performs the decoding process described above. If the coding method identified by the coding method identification code is a coding method that does not involve using a code table, the quotient decoding part 210 decodes the code of the quotient according to a decoding method corresponding to the coding method identified by the coding method identification code, such as Golomb coding, Golomb-Rice coding and unary coding.

[Step Sd2]

A determination part 220 of the decoding apparatus 2 determines whether the separation parameter B equals to 0 or equals to or greater than 1, from the code that expresses the separation parameter B transmitted from the separation part 40. If B=0, the determination part 220 performs a control to transmit the code of the quotient for each sample in the frame transmitted from the separation part 40 to a first decoding part 230. If B≥1, the determination part 220 performs a control to transmit the code of the quotient for each sample in the frame transmitted from the separation part 40 to a second decoding part 240.

[Step Sd3]

(1) If the LSB of the binary code expressing the integer $y_i$ obtained in step Sd1 is 0, the first decoding part 230 of the decoding apparatus 2 produces an integer by multiplying the integer $y_i$ by ½. (2) If the LSB of the binary code expressing the integer $y_i$ obtained in step Sd1 is 1, the first decoding part 230 of the decoding apparatus 2 produces an integer by subtracting 1 from a negative integer obtained by inverting the sign of the integer y, and multiplying the integer $y_i$ by ½. The resulting integer is the value of the sample $x_i$ resulting from the decoding in the case where B=0. The symbol ">>" in the drawing represents a right shifting calculation.

[Step Sd4]

(1) If the MSB of the binary code expressing the remainder $z_i$ corresponding to the quotient $y_i$ included in the frame transmitted from the separation part 40 is 1, the second decoding part 240 of the decoding apparatus 2 produces an integer by adding the lower significant B–1 bits of the binary code expressing the remainder $z_i$ to a binary code of a value obtained by multiplying the integer $y_i$ obtained in step Sd1 by $2^{B-1}$ using the separation parameter B transmitted from the separation part 40. (2) If the MSB of the binary code expressing the remainder $z_i$ corresponding to the quotient $y_i$ included in the frame transmitted from the separation part 40 is 0, the second decoding part 240 of the decoding apparatus 2 produces an integer by subtracting 1 from a negative integer obtained inverting the sign of an integer obtained by adding the lower B−1 bits of the binary code expressing the remainder $z_i$ (or B-bit binary code expressing the remainder $z_i$) to the binary code of the value obtained by multiplying the integer $y_i$ obtained in step Sd1 by $2^{B-1}$ using the separation parameter B transmitted from the separation part 40. The resulting integer is the value of the sample $x_i$ resulting from the decoding. The symbol "<<" in the drawing represents a left shifting calculation, the symbol "&" represents a bit-based logical product calculation, and the symbol "|" represents a bit-based logical addition calculation.

Each sample of the input signal has been described above as being expressed by a positive or negative integer. However, if each sample of the input signal is expressed by an integer with a positive sign in a coding method applied to an audio signal, for example, there is no need to distinguish whether the sign of each sample is positive or negative. In such a case, the separation parameter B can be determined according to the formula (10), the quotient $y_i$ can be determined according to the formula (15) or (16), and the remainder $z_i$ can be determined according to the formula (17).

The case where B≥1:

$$y_i = \left\lfloor \frac{x_i}{2^B} \right\rfloor \quad (15)$$

The case where B=0:

$$y_i = x_i \quad (16)$$

$$z_i = x_i - \left\lfloor \frac{x_i}{2^B} \right\rfloor \cdot 2^B \quad (17)$$

Summary of Coding According to Embodiment 4 of Invention

Figure 9:
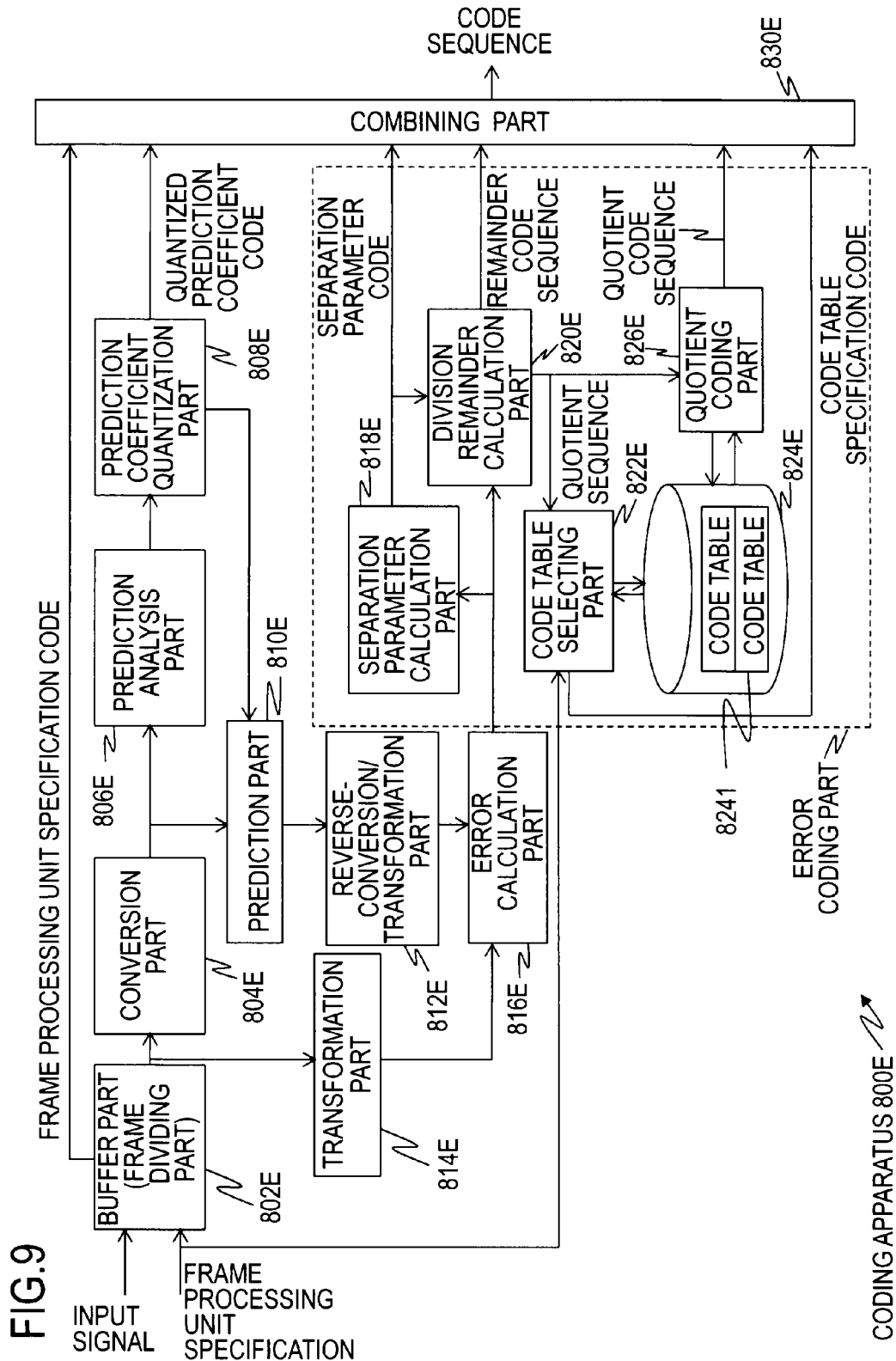
FIG. 9 is a block diagram showing an exemplary functional configuration of a coding apparatus according to an embodiment 4.

In an embodiment 4, another example in which the coding according to the present invention is applied to lossless coding of an audio signal that is previously coded according to G.711 will be described with reference to FIG. 9.

The input signal is an audio signal coded according to G.711, which is a code sequence of 8-bit codes each expressing one sample, which will be referred to as a G.711 code sequence. The input G.711 code sequence is coded in a coding apparatus 800E in specified frame processing units.

The frame processing unit is selected from among 40 samples, 80 samples, 160 samples, 240 samples and 320 samples and is externally specified before coding.

A buffer part 802E divides the input G.711 code sequence into the specified frame processing units (40 samples, for example) and passes them to a conversion part 804E. The buffer part 802E also outputs a code for identifying the specified frame processing unit as a frame processing unit specification code.

The conversion part 804E converts each code in each frame processing unit of the G.711 code sequence into a corresponding PCM value and outputs a PCM value sequence for each frame processing unit.

A prediction analysis part 806E performs prediction analysis of the PCM value sequence output from the conversion part 804E to determine a prediction coefficient. (For example, the prediction analysis part 806E can use linear prediction analysis. However, the prediction analysis method is not limited to the linear prediction analysis, and any prediction can be used as far as a prediction coefficient for the PCM value sequence can be obtained.)

A prediction coefficient quantization part 808E quantizes the prediction coefficient determined by the prediction analysis part 806E to determine a quantized prediction coefficient and outputs a quantized prediction coefficient code corresponding to the quantized prediction coefficient.

A prediction part 810E estimates the PCM value sequence for the samples of the current frame processing unit from the quantized prediction coefficient and a past PCM value sequence.

A reverse-conversion/transformation part 812E codes each PCM value in the PCM value sequence estimated by the prediction part 810E according to G.711 and converts the codes into 8-bit values (estimated sample values), such as −128 to +127, expressed by 2's complements while maintaining the magnitude relationship among the values expressed by the codes. For example, the transformation described in Japanese Patent Application No. 2007-319805 (International Application No. PCT/JP2008/072513) can also be used.

For example, the transformation is performed as follows. It is checked whether there is a number that falls within a particular range and does not occur in a G.711 code sequence $\Lambda = \{\lambda(1), \lambda(2), \ldots, \lambda(N)\}$, where N represents the number of samples in one frame. The particular range are the number that indicates a positive value with the smallest absolute value and the number that indicates a negative value with the smallest absolute value, for example. More specifically, the numbers are "+0" and "−0" in the case of the μ-law according to ITU-T G.711 and are "+8" and "−8" in the case of the A-law. If it is determined that there is a number that does not occur, the magnitudes of the original signals are renumbered excluding the original signal represented by the number that does not occur, the magnitudes of the original signals are renumbered excluding the magnitude of the original signal represented by the number that does not occur, and a number sequence $T(\Lambda) = \{T(\lambda(1)), T(\lambda(2)), \ldots, T(\lambda(N))\}$ of the reassigned numbers formed by replacing the codes of the G.711 code sequence with the reassigned numbers is output. For example, consider the case of the μ-law according to the ITU-T G.711. According to the μ-law, numbers from "−127" to "+127" are expressed by 8 bits. However, the number "0" is expressed in two ways, "+0" and "−0". In the relationship between the numbers and values in linear relationship with the original signals, the number "−127" represents a value <−8031>, the number "+127" represents a value <+8031>, and the numbers "+0" and "−0" represent a value <0>. Note that a numeric enclosed in quotation marks (" ") represents a number that indicates the magnitude of an original signal (the magnitude relationship between original signals), and a numeric enclosed in angle brackets (< >) represents the amplitude of a signal in a linear relationship with an original signal. Since the numbers "+0" and "−0" are redundant, some coding apparatuses output only one of the numbers. For example, it is supposed that the particular range is defined as "+0" and "−0". Then, if the number "−0" does not occur, the negative numbers are shifted by one, so that the number "−0" represents a value <−1>, and the number "−126" represents a value <−8031>. If the number "+0" does not occur, the positive numbers are shifted by one, so that the number "+0" represents a value <+1>. If both the numbers "+0" and "−0" do not occur, both the negative numbers and the positive numbers are shifted by one, so that the number "−0" represents a value <−1>, and the number "+0" represents a value <+1>.

A transformation part 814E converts each code in each frame processing unit of the G.711 code sequence into an 8-bit value (transformed input sample value) expressed by a 2's complement falling within a range of −128 to +127 while maintaining the magnitude relationships among the values expressed by the codes. Again, the transformation described in Japanese Patent Application No. 2007-319805 (International Application No. PCT/JP2008/072513) can be used, for example, and an example of the transformation has already been described above.

An error calculation part 816E determines the difference between the estimated sample value in the 8-bit expression determined by the reverse-conversion/transformation part 812E and the transformed input sample value in the 8-bit expression determined by the transformation part 814E, thereby calculating the error between the transformed input sample value and the estimated sample value. The resulting error sequence is the integer value sequence $x_i$ that is used as an input in the coding method according to the present invention.

A separation parameter calculation part 818E receives the error sequence as an input in numbers equal to the number of samples in one frame processing unit and determines the separation parameter B for each frame processing unit.

In addition, the separation parameter calculation part 818E outputs a code corresponding to the separation parameter B as a separation parameter code. For example, as described above in the embodiment 3, a Huffman table variable-length coded according to the appearance frequency of the separation parameter B is previously set, and the code of the separation parameter B is determined using the Huffman table.

A division remainder calculation part 820E separates the error sequence x into a quotient sequence y and a remainder sequence z using the separation parameter B determined by the separation parameter calculation part 818E. In addition, the division remainder calculation part 820E outputs a remainder code sequence that is produced by coding each remainder in the remainder sequence into a B-bit code.

For the samples $x_i$ (i=1, 2, ..., N; N represents the number of samples in one frame) included in the error sequence x, the quotient $y_i$ and the remainder $z_i$ are determined using the separation parameter B for the sample $x_i$ converted into an integer equal to or greater than 0 according to the formula (12) or (13) as in the embodiment 3. In the case where the quotient $y_i$ is determined according to the formula (12), the code expressing the remainder is a B-bit fixed-length code including the B−1-bit binary code expressing the remainder and a 1-bit code that indicates whether the sample $x_i$ is positive or negative. In the case where the quotient $y_i$ is determined according to the formula (13), the least significant bit (LSB) of the code expressing the quotient $y_i$ indicates whether the sample $y_i$ is positive or negative. Note that any other separation method can be used for the separation into the quotient $y_i$ and the remainder $z_i$ using the separation parameter B as far as unique separation and combining are possible.

In the embodiment 4, the number of code tables is changed depending on the frame processing unit: one code table is used if the frame processing unit is 40 samples, and four code tables are prepared and one of them is selected for use if the frame processing unit is 80 samples or more. The reason for this is because using a plurality of code tables is not very advantageous when the frame processing unit is a relatively small number, 40 samples. That is, even if four code tables that differ in error sequence dispersion are used despite the increase of the amount of information because of the code table specification code required for selecting one of the four code tables, the code amount of the code sequence corresponding to the error sequence is not expected to decrease enough to cancel the increase of the amount of information because of to the code table specification code since the number of error coefficient samples to be coded is small (40 samples). To the contrary, in the case where the frame processing unit is 80 samples or more, if four code tables are prepared and one that is most suitable for the statistical characteristics of the error sequence is selected from among them based on the code table specification code, the code amount of the code sequence corresponding to the error sequence decreases enough to reduce the total code amount despite the increase of the code amount of information due to the code table specification code.

Figure 10:
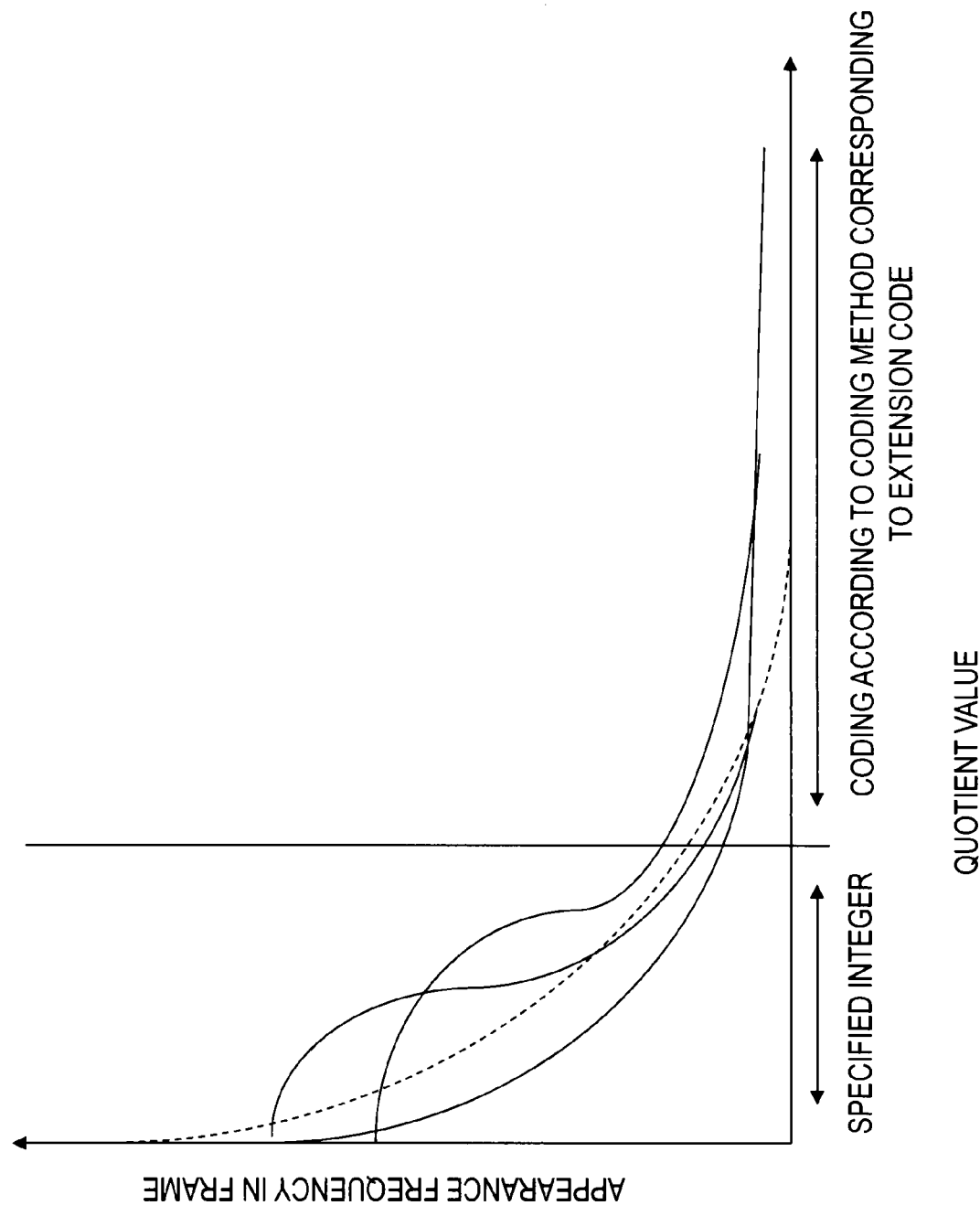
FIG. 10 is a graph showing an exemplary distribution of values of quotient signals.

FIG. 10 shows an exemplary distribution of values included in the quotient sequence determined by the division remainder calculation part 820E.

Values with smaller amplitudes tend to appear more frequently but may deviate from a Laplace distribution shown by the dotted line. Thus, from among the plurality of code tables, one that exhibits the closest frequency distribution to the appearance frequency distribution of the values of the quotient sequence in the frame is selected. If the appearance frequency of a value with high amplitude is higher than that shown by the Laplace distribution, the unary code that expresses the value may be an extremely long code. FIG. 11 shows exemplary code tables used in the case where the frame processing unit is 40 samples in the embodiment 4 and exemplary code tables used in the case where the frame processing unit is 80 samples or more. The code table and the coding method corresponding to the extension code are switched depending on the frame size and the separation parameter B.

A code table selecting part 822E receives the quotient sequence as an input, selects a code table 8241 stored in a storage part 824E so as to minimize the output code amount, and outputs the code table specification code corresponding to the selected code table. In the case where the frame processing unit is 80 samples or more, a code table that minimizes the total code amount of the quotient code sequence for the frame is selected from among the four code tables 0 to 3 (see FIG. 11), and the code table specification code corresponding to the code table is output. In the case where the frame processing unit is 40 samples, no code table specification code is output because there is only one code table.

A quotient coding part 826E codes the quotient sequence using the code table selected by the code table selecting part 822E and the coding method corresponding to the extension code uniquely determined by the frame processing unit and the separation parameter B and outputs the resulting quotient code sequence.

Figure 12:
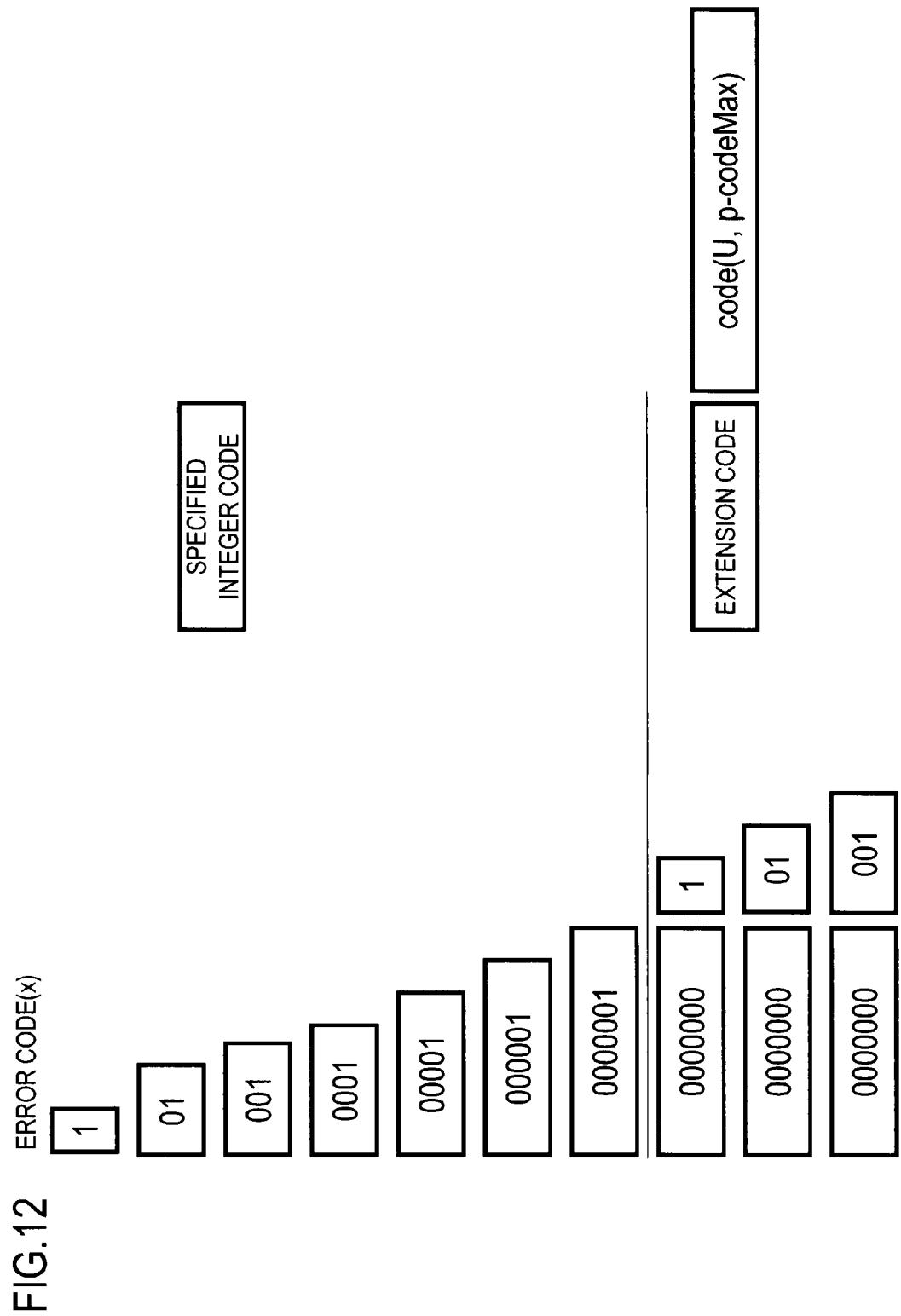
FIG. 12 is a diagram showing exemplary error codes output in the case where a separation parameter B=0.

In this process, in the case where B=0, a unary code "code (U, p1−maxCode)" is used as the coding method corresponding to the extension code regardless of the frame processing unit, as shown in the tables 0 to 3 in the upper part of FIG. 11. FIG. 12 shows exemplary quotient codes included in the quotient code sequence output in the case where the frame processing unit is 40 samples and B=0.

Figure 13:
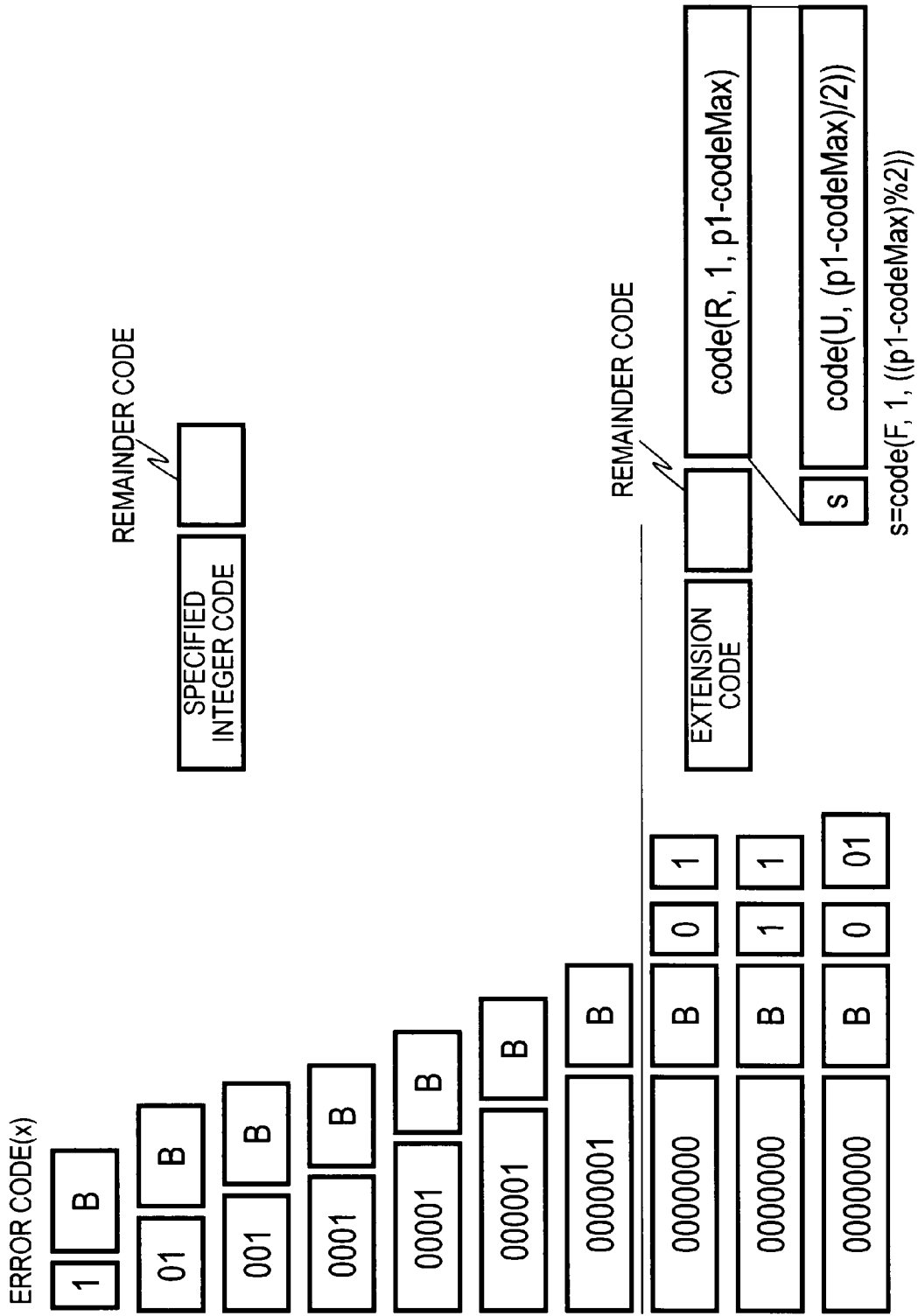
FIG. 13 is a diagram showing exemplary error codes output in the case where the separation parameter B>0.

In the case where B>0, a Golomb-Rice code "code(R, 1, p2−maxCode)" for the Rice parameter s=1 is used as the coding method corresponding to the extension code regardless of the frame processing unit, as shown in the tables 0 to 3 in the lower part of FIG. 11. FIG. 13 shows exemplary quotient codes included in the quotient code sequence output in the case where the frame processing unit is 40 samples and B>0.

According to the formula for calculating the separation parameter B, the separation parameter B=0 when the amplitude of the error sequence is small, and the separation parameter B>0 when the amplitude of the error sequence is large.

It is experimentally observed that the distribution is close to the Laplace distribution when the amplitude of the error sequence is small, that is, when the separation parameter B=0, and the distribution does not necessarily follow the Laplace distribution when the amplitude of the error sequence is large, that is, when the separation parameter B>0.

According to the observation, when the separation parameter B>0, values of the quotients with larger amplitudes than the Laplace distribution appear with high probabilities. The embodiment 4 takes this fact into consideration. In the case where the separation parameter B>0, the error codes are separated into the quotients and the remainders based on the separation parameter B. Then, of the quotients, those that are equal to or greater than the value maxCode previously determined for each code table are coded by Golomb-Rice coding with the Rice parameter s=1.

On the other hand, in the case where the separation parameter B=0, the quotients are coded into unary codes "code(U, p−maxCode)". The process of separating the error sequence into the quotients and the remainders based on the separation parameter B produces only the quotient sequence, because no remainders occur in the case where B=0.

As described above, since there is a correlation between the value of the separation parameter B and the appearance probability of each value of the quotient sequence, the coding efficiency can be improved by switching either or both of the code table and the coding method corresponding to the extension code depending on the value of the separation parameter B. Similarly, the code table and the coding method corresponding to the extension code are switched depending on the frame processing unit.

A combining part 830E combines the frame processing unit specification code, the quantized prediction coefficient code, the separation parameter code, the code table specification code, the quotient code sequence and the remainder code sequence output from the processing parts described above on a frame basis and outputs the resulting code sequence.

Summary of Decoding According to Embodiment 4 of Invention

Figure 14:
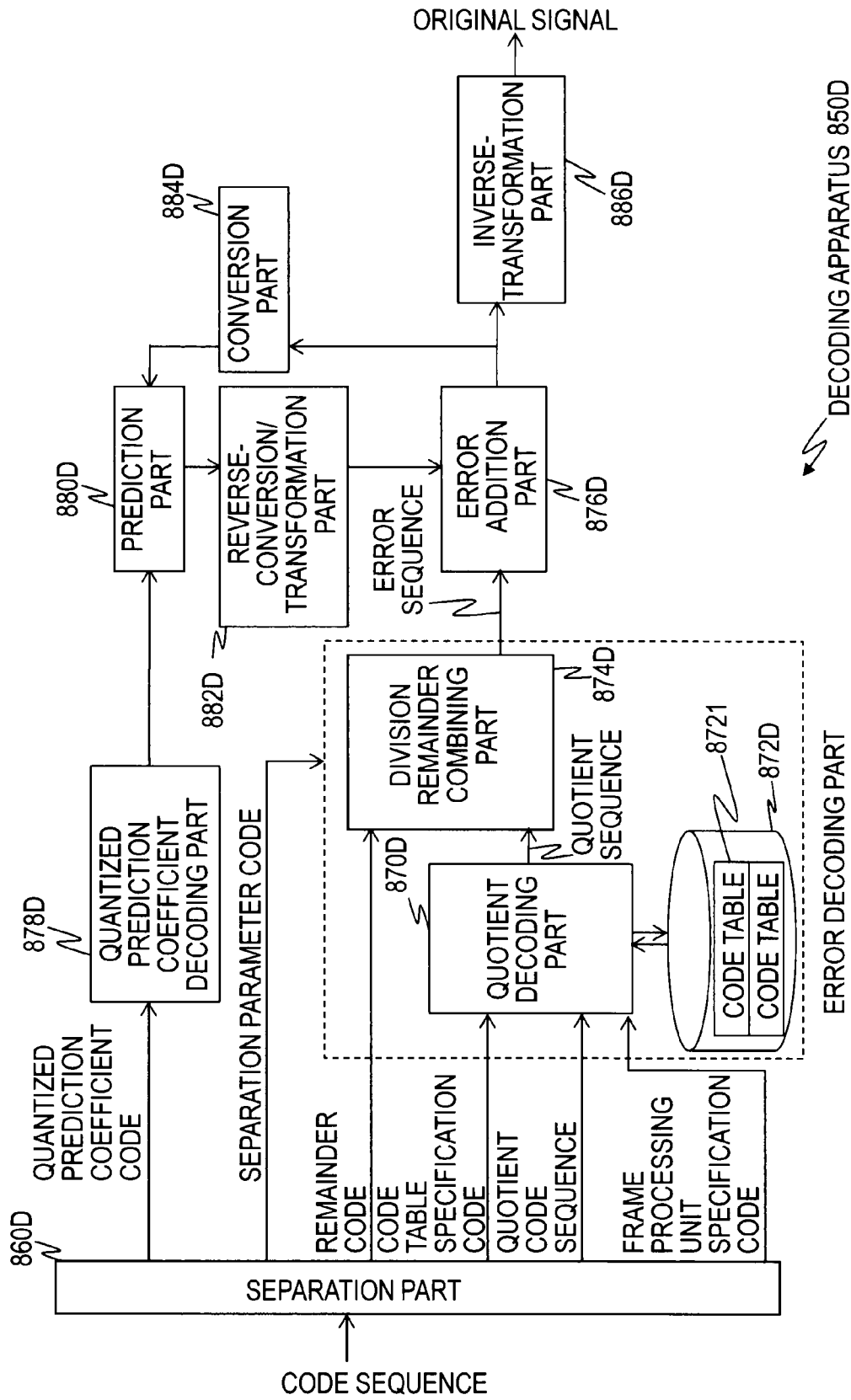
FIG. 14 is a block diagram showing an exemplary functional configuration of a decoding apparatus according to the embodiment 4.

A decoding process according to the embodiment 4 of the present invention will be described with reference to FIG. 14.

The code sequence produced by the coding according to the embodiment 4 described above is input to a decoding apparatus 850D.

A separation part 860D receives the code sequence as an input, separates the code sequence into the frame processing unit specification code, the quantized prediction coefficient code, the separation parameter code, the code table specification code, the quotient code sequence and the remainder code sequence, and transmits these elements to their respective processing parts.

A quotient decoding part 870D selects a code table 8721 (stored in a storage part 872D) used for decoding of the quotient code sequence of the frame based on the code table specification code and the frame processing unit specification code. In addition, the quotient decoding part 870D decodes the input quotient code sequence using the selected code table and outputs an integer value sequence corresponding to the quotient codes in the quotient code sequence as a quotient sequence.

The quotient sequence is transmitted to a division remainder combining part 874D.

The division remainder combining part 874D decodes the separation parameter code to determine the separation parameter B and determines the samples $x_i$ included in the error sequence using the remainders $z_i$ obtained by decoding of the remainder code sequence and the quotients $y_i$ included in the quotient sequence according to the following calculation. In the following calculation, y%2 represents the remainder of the division of y by 2. The resulting error sequence is transmitted to an error addition part 876D.

The case where B=0:

$$x_i = \begin{cases} y_i/2 & (y\%2 = 0) \\ -y_i/2 & (y\%2 > 0) \end{cases}$$

The case where B≥1:

$$x_i = \begin{cases} y_i \times 2^{B-1} + z_i & (z < 2^{B-1}) \\ -y_i \times 2^{B-1} - (z_i - 2^{B-1}) & (z \geq 2^{B-1}) \end{cases}$$

A quantized prediction coefficient decoding part 878D decodes the quantized prediction coefficient code received from the separation part 860D to produce the quantized prediction coefficient.

A prediction part 880D retains a sequence of PCM values converted from 8-bit integer values corresponding to a past G.711 code sequence decoded by a conversion part 884D, and estimate a PCM value sequence for each frame processing unit based on the past PCM value sequence and the quantized prediction coefficient.

The reverse-conversion/transformation part 882D codes each PCM value in the PCM value sequence estimated by the prediction part 880D according to G.711, and converts the codes into 8-bit values (estimated sample values), such as −128 to +127, expressed by 2's complements while maintaining the magnitude relationship among the values expressed by the codes. If the transformation described in Japanese Patent Application No. 2007-319805 (International Application No. PCT/JP2008/072513) is performed in the coding process, the corresponding processing is performed in the decoding process.

An error addition part 876D sums the estimated sample values determined by the reverse-conversion/transformation part 882D and the error values in the error sequence to determine 8-bit values (decoded transformed input sample value) expressed by 2's complements, such as −128 to +127, which are associated with the original G.711 codes and correspond to the "transformed input sample values" in the coding process, while maintaining the magnitude relationship among the values expressed by the codes.

In addition, the error addition part 876D performs the same processing on all the samples in the frame processing unit to produce a decoded transformed input sample value sequence.

An inverse-transformation part 886D reproduces the original G.711 code sequence from the resulting decoded transformed input sample value sequence.

<Details of Decoding Process in Quotient Decoding Part>

The quotient decoding part 870D may use a decode table when producing the quotient sequence from the quotient code sequence. In this embodiment, a preferred embodiment in which a decode table is used for decoding of the quotient code sequence will be described.

Figure 16:
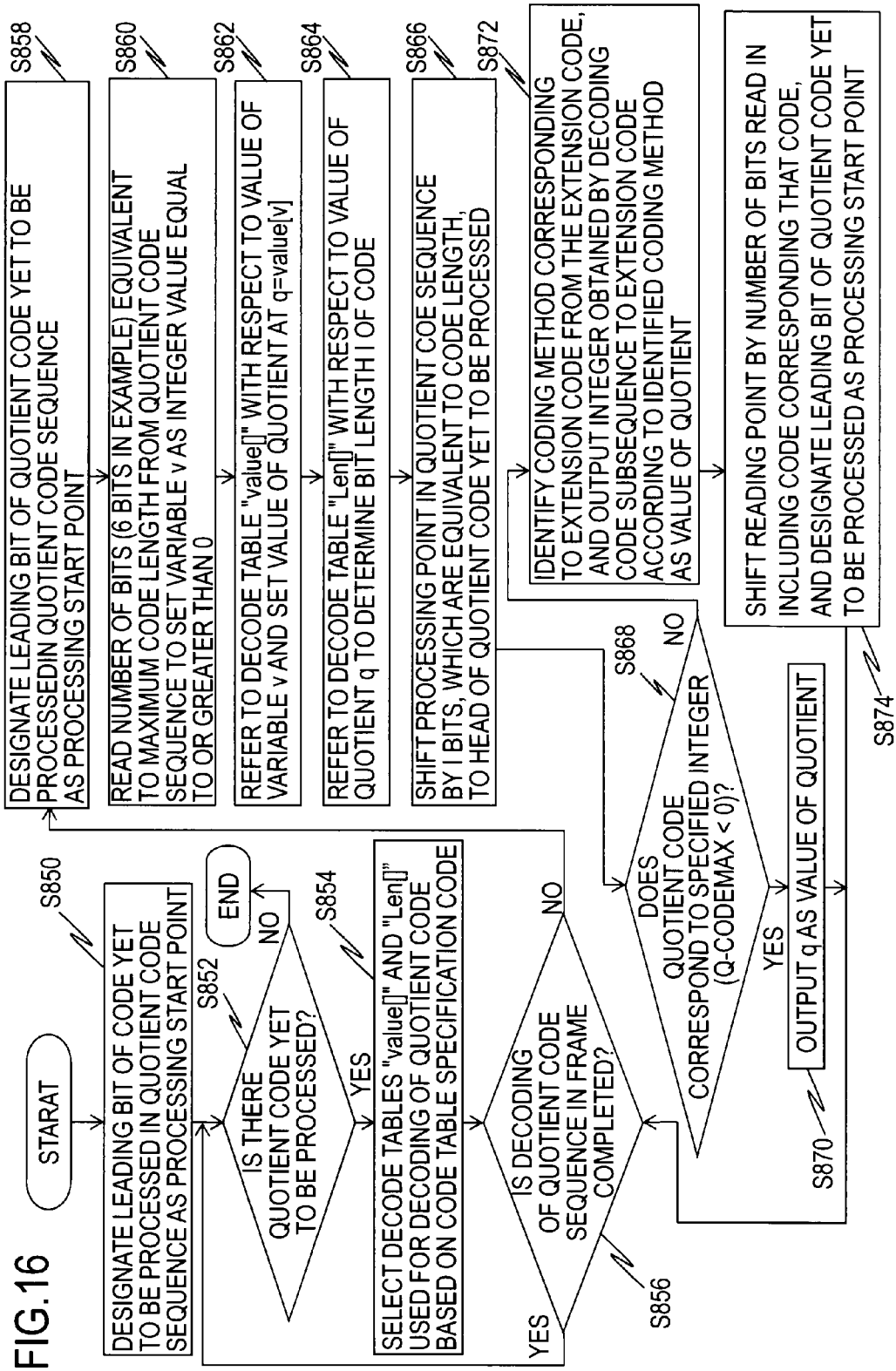
FIG. 16 is a diagram showing a flow of a decoding process according to the embodiment 4.

FIG. 15 shows an exemplary decode table corresponding to the code table 0 in the case where the frame processing unit is 80 samples or more. FIG. 16 shows an exemplary decoding procedure.

First, the leading bit of a quotient code yet to be processed in the quotient code sequence is designated as a processing start point (step S850). Then, it is determined whether or not there is a quotient code yet to be processed (step S852). If there is no such a code, the process is ended. If there is such a code, based on the code table specification code, decode tables "value[ ]" and "Len[ ]" used for decoding of the quotient code in the frame processing unit (in the frame) are selected (step S854). Then, it is determined whether or not the decoding of the quotient code sequence in the frame is completed (step S856). If the decoding is completed, the processing in step S852 is performed. If the decoding is not completed, the leading bit of a quotient code yet to be processed in the quotient code sequence is designated as a processing start point (step S858). A number of bits (6 bits in this example) equivalent to the maximum code length which one quotient code is allowed to have is read from the quotient code sequence to set a variable v as an integer value equal to or greater than 0 (step S860). The decode table "value[ ]" is referred to with respect to the variable v, and the value of the quotient is set to q=value[v] (step S862). Then, the decode table "Len[ ]" is referred to with respect to the value of the quotient q to determine the bit length I=Len[q] of the code (step S864). The processing point in the quotient code sequence is shifted by I bits, which are equivalent to the code length, to the head of the quotient code yet to be processed (step S866). It is checked whether or not the quotient code corresponds to a specified integer (q−codeMax<0) (step S868). If the quotient code corresponds to a specified integer, the value q is output as the value of the quotient (step S870). If the quotient code does not correspond to a specified integer, the coding method corresponding to the extension code is identified from the extension code, and the code subsequent to the extension code is decoded according to the identified coding method, and the resulting integer value is output as the value of the quotient (step S872). The reading point is shifted by the number of bits read in including the code corresponding the code, and the leading bit of the quotient code yet to be processed is designated as a processing start point (step S874). Following steps 870 and S874, the processing in step S856 is performed.

That is, the quotient decoding part 870D reads in the code table specification code from the code sequence, and selects the decode table corresponding to the code table specification code.

Values corresponding to those in the code table are registered in the decode table.

The quotient code is a code having a variable bit length that is input as a consecutive bit sequence from the leading bit.

The quotient decoding part reads in a number of bits equivalent to the maximum code length from the leading bit as an integer value.

In this example, since the maximum code length of the code registered in the code table is 6 bits, the quotient decoding part reads in 6 bits, regards these bits as an integer equal to or greater than 0, and sets the value as the variable v. If there is no code to be read in, bits 0 are added on the LSB side until the maximum code length is reached, and then, sequences in the decode table can be referred to.

Then, the value q corresponding to the 6-bit quotient code is recovered using the "value[ ]" table, which is the decode table corresponding to the code table selected based on the code table specification code. That is, the value q resulting from the decoding can be determined according to q=value[v] by using the v set as described above as the subscript of the sequence.

Then, the code length I of the actual code is determined. The code length can be easily determined according to I=len[v] or I=Len[q]. The position of the quotient code to be processed can be shifted by the determined I bits to the leading bit of the quotient code yet to be processed.

As described above, even the code having a variable code length can be quickly decoded simply by unqualifiedly reading a number of bits equivalent to the maximum code length and referring to sequences in the decode table based on the value, without performing a complicated decoding process.

The code length can also be determined simply by referring to sequences in the decode table.

In addition, if the maximum code length is fixed in designing the code table, the memory size required to retain the data in the decode table can be limited.

In this example, in designing the code table shown in FIG. 15, the maximum code length of the codes registered in the code table is limited to 6 bits, thereby limiting the size of the decode table.

Then, it is determined whether or not the value q resulting from the decoding is greater than codeMax, thereby checking whether or not the quotient the code corresponds to a specified integer. If (q−codeMax)<0, the quotient code corresponds to a specified integer. If (q−codeMax) 0, the quotient code corresponds to an extension code.

If the quotient code corresponds to a specified integer, the determined q is output as the value of the quotient, and the processing start point is shifted by the code length. The code length I can be determined according to I=Len[q] as described above.

If the quotient code corresponds to an extension code, the extension code corresponding to the determined q is identified (in the case shown in the drawings, the extension code p1 when q=7).

In addition, the code reading position is shifted by the code length I of the extension code, thereby shifting the processing start point to the head of the quotient code yet to be processed. The code length I can be determined according to I=Len[q] as described above.

Then, the quotient q is determined by decoding the code subsequent to the extension code according to the decoding method corresponding to the extension code.

The reading position is shifted by the number of bits read in including the bits of the code corresponding to the extension code, thereby designating the leading bit of the quotient code yet to be processed as a processing start point.

The processing of the frame is completed when an equal number of quotient code sequences to the number of samples in the frame are decoded according to the procedure described above.

The coding apparatus, the coding method, the decoding apparatus and the decoding method according to the present invention are not limited to the embodiments described above and can be appropriately modified without departing from the spirit of the present invention. Furthermore, technical characteristics mentioned in the above description can be arbitrarily combined with each other as far as they are not contradictory to each other.

In the case where the processing capabilities of the coding apparatus or the decoding apparatus described above are implemented by a computer, the processing capabilities of the apparatus are described in a program. The computer executes the program to implement the processing capabilities of the coding apparatus or the decoding apparatus.

The program that describes the specific processings can be recorded in a computer-readable recording medium. The computer-readable recording medium may be any type of recording medium, such as a magnetic recording device, an optical disk, a magneto-optical recording medium and a semiconductor memory. More specifically, the magnetic recording device may be a hard disk device, a flexible disk or a magnetic tape. The optical disk may be a digital versatile disc (DVD), a digital versatile disc random access memory (DVD-RAM), a compact disc read only memory (CD-ROM), or a compact disc recordable/rewritable (CD-R/CD-RW). The magneto-optical recording medium may be a magneto-optical disc (MO). The semiconductor memory may be an electronically erasable and programmable-read only memory (EEP-ROM).

The program may be distributed by selling, transferring or lending a portable recording medium, such as a DVD and a CD-ROM, in which the program is recorded, for example. Alternatively, the program may be distributed by storing the program in a storage device in a server computer and transferring the program from the server computer to other computers via a network.

The computer that executes the program first temporarily stores, in a storage device thereof, the program recorded in a portable recording medium or transferred from a server computer, for example. Then, when performing the processings, the computer reads the program from the recording medium and performs the processings according to the read program. In an alternative implementation of the program, the computer may read the program directly from the portable recording medium and perform the processings according to the program. As a further alternative, the computer may perform the processings according to the program each time the computer receives a program transferred from the server computer. As a further alternative, the processings described above may be performed on an application service provider (ASP) basis, in which the server computer does not transmit the program to the computer, and the processing capabilities are implemented only through execution instruction and result acquisition. The programs according to the embodiments of the present invention include a quasi-program, which is information processed by a computer (data or the like that is not a direct instruction to a computer but has a property that defines the processings performed by the computer).

In the embodiments described above, the coding apparatus and the decoding apparatus are implemented by executing a predetermined program on a computer. However, at least part of the processings may be implemented in the form of hardware.

What is claimed is:

1. A coding method for an integer value sequence, wherein [1] codes corresponding to integers (referred to as specified integers hereinafter) and [2] codes (referred to as extension codes hereinafter) corresponding to sets of a plurality of integers other than the specified integers are previously determined, and
the coding method comprises a coding step of performing coding in such a manner that the code corresponding to the specified integer is adopted as the result of the coding in a case where an integer value to be coded in the integer value sequence is the specified integer, and a code obtained by combining the extension code and a code obtained by applying a predetermined coding method corresponding to the extension code (referred to as an extension coding method hereinafter) to the integer value to be coded is adopted as the result of the coding in a case where the integer value to be coded in the integer value sequence is not the specified integer.

2. The coding method according to claim 1, wherein each sample in an input signal is expressed by an integer,
the coding method comprises:
a separation parameter calculation step of determining a value (referred to as a separation parameter hereinafter) for determining a divisor for the samples in the input signal on a frame basis, the frame including a predetermined number of samples in the input signal; and
a division remainder calculation step of determining a quotient and a remainder in a case where the divisor determined by the separation parameter is greater than 1 or determining a quotient in a case where the divisor equals to 1 for each sample in the frame of the input signal, and
in the coding step, the coding is performed by using the quotient as the integer value to be coded.

3. The coding method according to claim 2, wherein a plurality of code tables are previously determined in which [1] the codes corresponding to the specified integers and [2] the extension codes corresponding to the sets of a plurality of integers other than the specified integers are recorded, and
in the coding step, one of the plurality of code tables is selected and used for each frame of a predetermined number of integer values.

4. The coding method according to claim 3, wherein in the coding step,
the quotient is further coded according to a coding method that does not use the code table, and
the code with the smaller code amount of the code of the quotient obtained by the coding that does not use the code table and the code of the quotient obtained by the coding that uses the code table is output.

5. The coding method according to claim 4, wherein each sample in the input signal is expressed by an integer with a positive or negative sign, and
in the division remainder calculation step,
the quotient and the remainder are determined in a case where the divisor determined by the separation parameter is greater than 1 or the quotient is determined in a case where the divisor equals to 1 for each sample in the frame of the input signal converted into an integer equal to or greater than 0.

6. The coding method according to claim 2 or 3, wherein a set of a plurality of code tables (referred to as a table set hereinafter) is previously determined in which [1] the codes corresponding to the specified integers and [2] the extension codes corresponding to the sets of a plurality of integers other than the specified integers are recorded,
the extension coding method for each code table is associated with the separation parameter, and
in the coding step, one of the code tables in the table set is used, and the coding is performed in such a manner that a code obtained by combining the extension code and a code obtained by applying the extension coding method corresponding to the separation parameter to the quotient is adopted as the result of the coding in a case where the quotient is not the specified integer.

7. The coding method according to claim 6, wherein in the coding step,
the quotient is further coded according to a coding method that does not use the code table, and
the code with the smaller code amount of the code of the quotient obtained by the coding that does not use the code table and the code of the quotient obtained by the coding that uses the code table is output.

8. The coding method according to claim 7, wherein each sample in the input signal is expressed by an integer with a positive or negative sign, and
in the division remainder calculation step,
the quotient and the remainder are determined in a case where the divisor determined by the separation parameter is greater than 1 or the quotient is determined in a case where the divisor equals to 1 for each sample in the frame of the input signal converted into an integer equal to or greater than 0.

9. The coding method according to claim 6, wherein each sample in the input signal is expressed by an integer with a positive or negative sign, and
in the division remainder calculation step,
the quotient and the remainder are determined in a case where the divisor determined by the separation parameter is greater than 1 or the quotient is determined in a case where the divisor equals to 1 for each sample in the frame of the input signal converted into an integer equal to or greater than 0.

10. The coding method according to claims 2 or 3, wherein each sample in the input signal is expressed by an integer with a positive or negative sign, and
in the division remainder calculation step,
the quotient and the remainder are determined in a case where the divisor determined by the separation parameter is greater than 1 or the quotient is determined in a case where the divisor equals to 1 for each sample in the frame of the input signal converted into an integer equal to or greater than 0.

11. The coding method according to claim 2, wherein the number of extension coding methods corresponding to the extension code is equal to or greater than 2,
each of the plurality of extension coding methods is associated with the separation parameter, and
in the coding step, the coding is performed in such a manner that a code obtained by combining the extension code and a code obtained by applying the extension coding method corresponding to the separation parameter to the quotient is adopted as the result of the coding in a case where the quotient is not the specified integer.

12. The coding method according to claim 11, wherein each sample in the input signal is expressed by an integer with a positive or negative sign, and
in the division remainder calculation step,
the quotient and the remainder are determined in a case where the divisor determined by the separation parameter is greater than 1 or the quotient is determined in a case where the divisor equals to 1 for each sample in the frame of the input signal converted into an integer equal to or greater than 0.

13. A computer-readable recording medium in which a program that makes a computer perform each step in a coding method according to claim 1 is recorded.

14. A coding apparatus for an integer value sequence, wherein [1] codes corresponding to integers (referred to as specified integers hereinafter) and [2] codes (referred to as extension codes hereinafter) corresponding to sets of a plurality of integers other than the specified integers are previously determined, and
the coding apparatus comprises a coding part that performs coding in such a manner that the code corresponding to the specified integer is adopted as the result of the coding in a case where an integer value to be coded in the integer value sequence is the specified integer, and a code obtained by combining the extension code and a code obtained by applying a predetermined coding method corresponding to the extension code to the integer value to be coded is adopted as the result of the coding in a case where the integer value to be coded in the integer value sequence is not the specified integer.

15. The coding apparatus according to claim 14, wherein each sample in an input signal is expressed by an integer,
the coding apparatus comprises:
a separation parameter calculation part that determines a value (referred to as a separation parameter hereinafter) for determining a divisor for the samples in the input signal on a frame basis, the frame including a predetermined number of samples in the input signal; and
a division remainder calculation part that determines a quotient and a remainder in a case where the divisor determined by the separation parameter is greater than 1 or determines a quotient in a case where the divisor equals to 1 for each sample in the frame of the input signal, and
the coding part performs the coding by regarding the determined quotient as the integer value to be coded.

16. The coding apparatus according to claim 15, wherein a plurality of code tables are previously determined in which [1] the codes corresponding to the specified integers and [2] the extension codes corresponding to the sets of a plurality of integers other than the specified integers are recorded, and
the coding part selects and uses one of the plurality of code tables for each frame of a predetermined number of integer values.

17. The coding apparatus according to claim 15 or 16, wherein a set of a plurality of code tables (referred to as a table set hereinafter) is previously determined in which [1] the codes corresponding to the specified integers and [2] the extension codes corresponding to the sets of a plurality of integers other than the specified integers are recorded,
the extension coding method for each code table is associated with the separation parameter, and
the coding part uses one of the code tables in the table set and performs the coding in such a manner that a code obtained by combining the extension code and a code obtained by applying the extension coding method corresponding to the separation parameter to the quotient is adopted as the result of the coding in a case where the quotient is not the specified integer.

18. The coding apparatus according to claim 17, wherein each sample in the input signal is expressed by an integer with a positive or negative sign, and
the division remainder calculation part determines the quotient and the remainder in a case where the divisor determined by the separation parameter is greater than 1 or determines the quotient in a case where the divisor equals to 1 for each sample in the frame of the input signal converted into an integer equal to or greater than 0.

19. The coding apparatus according to claims 15 or 16, wherein each sample in the input signal is expressed by an integer with a positive or negative sign, and
the division remainder calculation part determines the quotient and the remainder in a case where the divisor determined by the separation parameter is greater than 1 or determines the quotient in a case where the divisor equals to 1 for each sample in the frame of the input signal converted into an integer equal to or greater than 0.

20. The coding apparatus according to claim 15, wherein the number of extension coding methods corresponding to the extension code is equal to or greater than 2, each of the plurality of extension coding methods is associated with the separation parameter, and the coding part performs the coding in such a manner that a code obtained by combining the extension code and a code obtained by applying the extension coding method corresponding to the separation parameter to the quotient is adopted as the result of the coding in a case where the quotient is not the specified integer.

21. The coding apparatus according to claim 20, wherein each sample in the input signal is expressed by an integer with a positive or negative sign, and the division remainder calculation part determines the quotient and the remainder in a case where the divisor determined by the separation parameter is greater than 1 or determines the quotient in a case where the divisor equals to 1 for each sample in the frame of the input signal converted into an integer equal to or greater than 0.

22. A decoding method for a code sequence, wherein [1] codes corresponding to integers (referred to as specified integers hereinafter) and [2] codes (referred to as extension codes hereinafter) corresponding to sets of a plurality of integers other than the specified integers are previously determined, and the decoding method comprises a decoding step of performing decoding in such a manner that in a case where a code in the code sequence is the code corresponding to the specified integer, the specified integer corresponding to the code is adopted as the result of the decoding, and in a case where a code in the code sequence is not the code corresponding to the specified integer, an integer value obtained by applying a decoding method corresponding to a predetermined coding method corresponding to the extension code (referred to as an extension coding method hereinafter) to a code subsequent to the extension code is adopted as the result of the decoding.

23. The decoding method according to claim 22, comprising:

a combining step of decoding each sample depending on a value (referred to as a separation parameter hereinafter) that is used for determining a divisor for each sample when the code sequence of a plurality of samples is obtained in such a manner that the sample is decoded using the result of the decoding in the decoding step in a case where the divisor determined by the separation parameter is 1, and the sample is decoded using the result of the decoding in the decoding step and a code sequence different from the code sequence in a case where the divisor determined by the separation parameter is greater than 1.

24. The decoding method according to claim 23, wherein a set of a plurality of code tables (referred to as a table set hereinafter) is previously determined in which [1] the codes corresponding to the specified integers and [2] the extension codes corresponding to the sets of a plurality of integers other than the specified integers are recorded, the extension coding method for each code table is associated with the separation parameter, and in the decoding step, one of the code tables in the table set is used, the decoding is performed in such a manner that an integer value obtained by applying a decoding method corresponding to the extension coding method corresponding to the separation parameter to a code subsequent to the extension code is adopted as the result of the decoding in a case where a code in the code sequence is a code that does not correspond to the specified integer.

25. The decoding method according to claim 23, wherein the number of extension coding methods corresponding to the extension code is equal to or greater than 2, each of the plurality of extension coding methods is associated with the separation parameter, and in the decoding step, the decoding is performed in such a manner that an integer value obtained by applying a decoding method corresponding to the extension coding method corresponding to the separation parameter to a code subsequent to the extension code is adopted as the result of the decoding in a case where a code in the code sequence is a code that does not correspond to the specified integer.

26. The decoding method according to claim 25, wherein each of the samples is expressed by an integer with a positive or negative sign, and the result of the decoding in the decoding step is a quotient obtained by dividing the sample converted into an integer equal to or greater than 0 by the divisor.

27. The decoding method according to claim 22 or 23, wherein a plurality of code tables are previously determined in which [1] the codes corresponding to the specified integers and [2] the extension codes corresponding to the sets of a plurality of integers other than the specified integers are recorded, and in the decoding step, one of the plurality of code tables is selected and used for each frame of the code sequence.

28. The decoding method according to claim 27, wherein a set of a plurality of code tables (referred to as a table set hereinafter) is previously determined in which [1] the codes corresponding to the specified integers and [2] the extension codes corresponding to the sets of a plurality of integers other than the specified integers are recorded, the extension coding method for each code table is associated with the separation parameter, and in the decoding step, one of the code tables in the table set is used, the decoding is performed in such a manner that an integer value obtained by applying a decoding method corresponding to the extension coding method corresponding to the separation parameter to a code subsequent to the extension code is adopted as the result of the decoding in a case where a code in the code sequence is a code that does not correspond to the specified integer.

29. A computer-readable recording medium in which a program that makes a computer perform each step in a decoding method according to claim 22 is recorded.

30. A decoding apparatus for a code sequence, wherein [1] codes corresponding to integers (referred to as specified integers hereinafter) and [2] codes (referred to as extension codes hereinafter) corresponding to sets of a plurality of integers other than the specified integers are previously determined, and the decoding apparatus comprises a decoding part that performs decoding in such a manner that in a case where a code in the code sequence is the code corresponding to the specified integer, the specified integer corresponding to the code is adopted as the result of the decoding, and in a case where a code in the code sequence is not the code corresponding to the specified integer, an integer value obtained by applying a decoding method corresponding to a predetermined coding method corresponding to the extension code (referred to as an extension coding method hereinafter) to a code subsequent to the extension code is adopted as the result of the decoding.

31. The decoding apparatus according to claim 30, further comprising:
a combining part that decodes each sample depending on a value (referred to as a separation parameter hereinafter) that is used for determining a divisor for each sample when the code sequence of a plurality of samples is obtained in such a manner that the sample is decoded using the result of the decoding by the decoding part in a case where the divisor determined by the separation parameter is 1, and the sample is decoded using the result of the decoding by the decoding part and a code sequence different from the code sequence in a case where the divisor determined by the separation parameter is greater than 1.

32. The decoding apparatus according to claim 31, wherein a set of a plurality of code tables (referred to as a table set hereinafter) is previously determined in which [1] the codes corresponding to the specified integers and [2] the extension codes corresponding to the sets of a plurality of integers other than the specified integers are recorded,
the extension coding method for each code table is associated with the separation parameter, and
the decoding part uses one of the code tables in the table set and performs the decoding in such a manner that an integer value obtained by applying a decoding method corresponding to the extension coding method corresponding to the separation parameter to a code subsequent to the extension code is adopted as the result of the decoding in a case where a code in the code sequence is a code that does not correspond to the specified integer.

33. The decoding apparatus according to claim 31, wherein the number of extension coding methods corresponding to the extension code is equal to or greater than 2,
each of the plurality of extension coding methods is associated with the separation parameter, and
the decoding part performs the decoding in such a manner that an integer value obtained by applying a decoding method corresponding to the extension coding method corresponding to the separation parameter to a code subsequent to the extension code is adopted as the result of the decoding in a case where a code in the code sequence is a code that does not correspond to the specified integer.

34. The decoding apparatus according to claim 33, wherein each of the samples is expressed by an integer with a positive or negative sign, and
the result of the decoding by the decoding part is a quotient obtained by dividing the sample converted into an integer equal to or greater than 0 by the divisor.

35. The decoding apparatus according to claim 30 or 31, wherein a plurality of code tables are previously determined in which [1] the codes corresponding to the specified integers and [2] the extension codes corresponding to the sets of a plurality of integers other than the specified integers are recorded, and
the decoding step selects and uses one of the plurality of code tables for each frame of the code sequence.

36. The decoding apparatus according to claim 35, wherein a set of a plurality of code tables (referred to as a table set hereinafter) is previously determined in which [1] the codes corresponding to the specified integers and [2] the extension codes corresponding to the sets of a plurality of integers other than the specified integers are recorded,
the extension coding method for each code table is associated with the separation parameter, and
the decoding part uses one of the code tables in the table set and performs the decoding in such a manner that an integer value obtained by applying a decoding method corresponding to the extension coding method corresponding to the separation parameter to a code subsequent to the extension code is adopted as the result of the decoding in a case where a code in the code sequence is a code that does not correspond to the specified integer.

37. A coding method for an integer value sequence,
wherein a plurality of code tables are previously determined in which [1] codes corresponding to integers (referred to as specified integers hereinafter) and [2] codes (referred to as extension codes hereinafter) corresponding to sets of a plurality of integers other than the specified integers are recorded, and
the coding method comprises a coding step of performing coding in such a manner that the code corresponding to the specified integer is adopted as the result of the coding in a case where an integer value to be coded in the integer value sequence is the specified integer, and a code obtained by combining the extension code and a code obtained by applying a predetermined coding method corresponding to the extension code (referred to as an extension coding method hereinafter) to the integer value to be coded is adopted as the result of the coding in a case where the integer value to be coded in the integer value sequence is not the specified integer, in the coding step one of the plurality of code tables is selected and used for each frame of a predetermined number of integer values.

38. A coding apparatus for an integer value sequence,
wherein a plurality of code tables are previously determined in which [1] codes corresponding to integers (referred to as specified integers hereinafter) and [2] codes (referred to as extension codes hereinafter) corresponding to sets of a plurality of integers other than the specified integers are recorded, and
the coding apparatus comprises a coding part that performs coding in such a manner that the code corresponding to the specified integer is adopted as the result of the coding in a case where an integer value to be coded in the integer value sequence is the specified integer, and a code obtained by combining the extension code and a code obtained by applying a predetermined coding method corresponding to the extension code to the integer value to be coded is adopted as the result of the coding in a case where the integer value to be coded in the integer value sequence is not the specified integer, the coding part selecting and using one of the plurality of code tables for each frame of a predetermined number of integer values.

* * * * *